(12) United States Patent
Takaya et al.

(10) Patent No.: US 11,152,928 B2
(45) Date of Patent: Oct. 19, 2021

(54) ELECTRONIC CIRCUIT, ELECTRONIC APPARATUS, AND METHOD

(71) Applicant: KABUSHIKI KAISHA TOSHIBA, Minato-ku (JP)

(72) Inventors: Satoshi Takaya, Kawasaki (JP); Hiroaki Ishihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 36 days.

(21) Appl. No.: 16/814,752

(22) Filed: Mar. 10, 2020

(65) Prior Publication Data

US 2021/0075410 A1 Mar. 11, 2021

(30) Foreign Application Priority Data

Sep. 6, 2019 (JP) .............................. JP2019-163403

(51) Int. Cl.
| | |
|---|---|
| *H03K 5/00* | (2006.01) |
| *H03K 5/133* | (2014.01) |
| *H01L 23/522* | (2006.01) |
| *G01R 19/252* | (2006.01) |
| *H01L 23/66* | (2006.01) |

(52) U.S. Cl.
CPC ....... *H03K 5/00006* (2013.01); *G01R 19/252* (2013.01); *H01L 23/522* (2013.01); *H01L 23/66* (2013.01); *H03K 5/133* (2013.01); *H01L 2223/6611* (2013.01); *H03K 2005/00026* (2013.01)

(58) Field of Classification Search
None
See application file for complete search history.

(56) References Cited

U.S. PATENT DOCUMENTS 4,926,131 A * 5/1990 Leydier .................... H03K 4/06
327/126
5,982,645 A * 11/1999 Levran .................. H01F 27/306
363/37
6,389,063 B1   5/2002 Kanekawa et al.
(Continued)

FOREIGN PATENT DOCUMENTS

| JP | 3628886 B2 | 3/2005 |
|---|---|---|
| JP | 2008-160672 A | 7/2008 |

(Continued)

*Primary Examiner* — Tuan T Lam
(74) *Attorney, Agent, or Firm* — Oblon, McClelland, Maier & Neustadt, L.L.P.

(57) ABSTRACT

An electronic circuit according to an embodiment includes a clock generator, a delay element, a first electromagnetic coupler, a first frequency converter, a second electromagnetic coupler, a second frequency converter, a controller and an output device. The clock generator is configured to generate a first clock signal. The delay element is configured to output a second clock signal which has a phase delayed with respect to the first clock signal. The first electromagnetic coupler is configured to transmit one of the first and second clock signals by electromagnetic coupling. The first frequency converter is driven by the one of the first and second clock signals transmitted from the first electromagnetic coupler and is configured to convert a first input signal to a first signal with a first frequency corresponding to the one of the first and second clock signals.

11 Claims, 19 Drawing Sheets

(56) References Cited

U.S. PATENT DOCUMENTS

| | | | |
|---|---|---|---|
| 8,378,663 | B2 | 2/2013 | Cadoux et al. |
| 8,390,270 | B2 | 3/2013 | Cadoux et al. |
| 9,112,482 | B2 | 8/2015 | Kumagawa et al. |
| 9,344,124 | B2 | 5/2016 | Lau et al. |
| 2015/0253359 | A1* | 9/2015 | Karraker ............... H02M 3/335 324/126 |
| 2016/0069960 | A1* | 3/2016 | Kokorin .................. H03K 7/06 324/426 |
| 2018/0372655 | A1 | 12/2018 | Dandy et al. |
| 2019/0121381 | A1* | 4/2019 | Jankowski ......... G01R 31/2884 |
| 2020/0241071 | A1* | 7/2020 | Ramadass ............ G01R 19/252 |

FOREIGN PATENT DOCUMENTS

| | | |
|---|---|---|
| JP | 6004968 B2 | 10/2016 |
| JP | 6203114 B2 | 9/2017 |
| JP | 6396432 B2 | 9/2018 |
| JP | 2019-29706 A | 2/2019 |
| JP | 2019-39904 A | 3/2019 |

* cited by examiner

US 11,152,928 B2

ELECTRONIC CIRCUIT, ELECTRONIC APPARATUS, AND METHOD

CROSS-REFERENCE TO RELATED APPLICATIONS

This application is based upon and claims the benefit of priority from Japanese Patent Application No. 2019-163403, filed on Sep. 6, 2019; the entire contents of which are incorporated herein by reference.

FIELD

Embodiments described herein relate generally to an electronic circuit, an electronic apparatus, and a method.

BACKGROUND

An electronic circuit that transmits an analog signal from an input device to an output device through isolation has been developed. The electronic circuit converts the analog signal into a high-frequency signal, transmits the high-frequency signal by electromagnetic coupling through the isolation, and then restores the original analog signal. In the electronic circuit, phase shift may occur, for the high-frequency analog signal is transmitted by the electromagnetic coupling, and restoration accuracy of the original analog signal may suffer. It is desirable to provide an electronic circuit that reduces effects from the phase shift in the signal due to electromagnetic coupling transmission.

DETAILED DESCRIPTION

Figure 1:
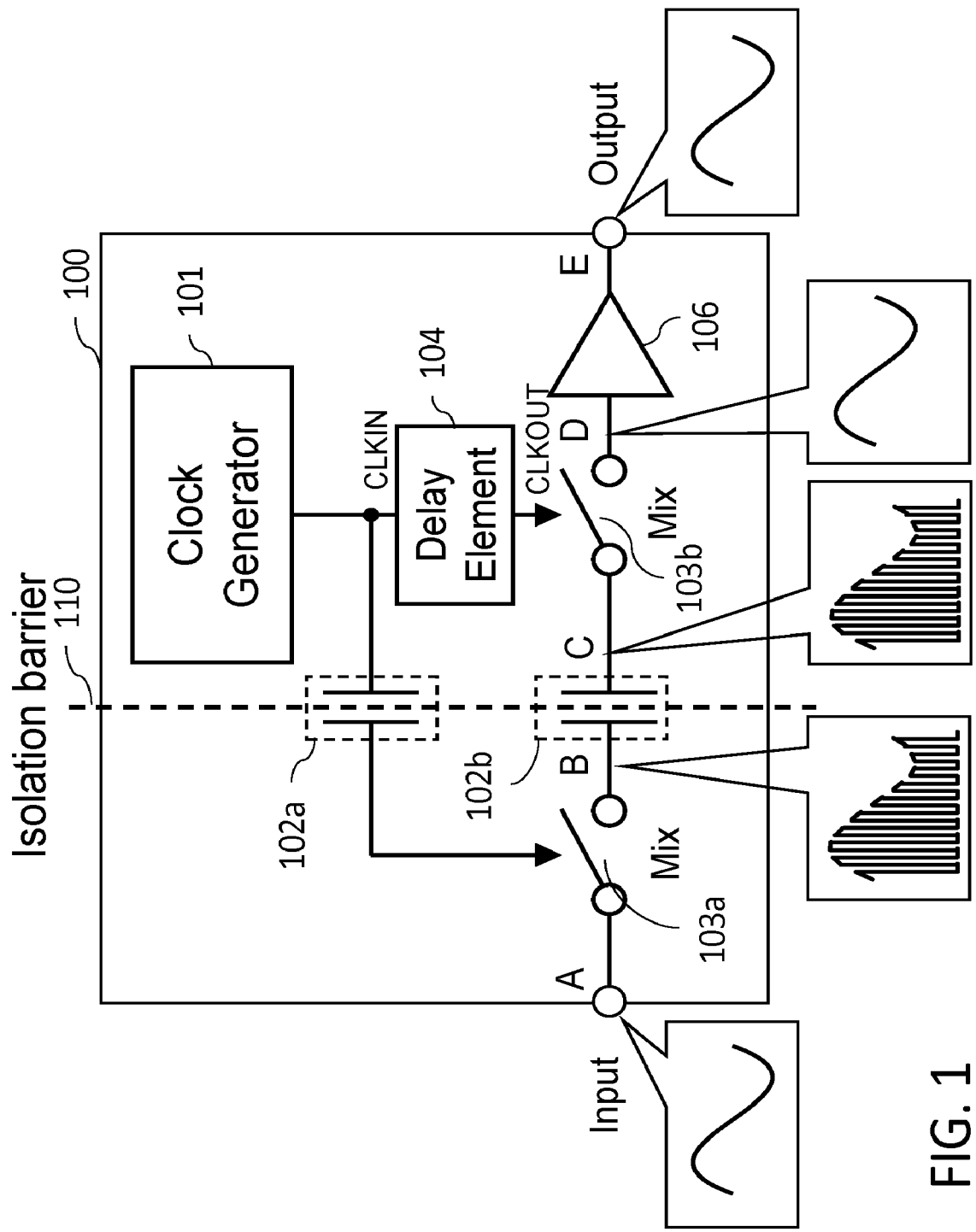
FIG. 1 is a diagram illustrating an overview of an electronic circuit 100 according to a first embodiment.

An electronic circuit according to an embodiment includes a clock generator, a delay element, a first electromagnetic coupler, a first frequency converter, a second electromagnetic coupler, a second frequency converter, a controller and an output device. The clock generator is configured to generate a first clock signal. The delay element is configured to output a second clock signal which has a phase delayed with respect to the first clock signal. The first electromagnetic coupler is configured to transmit one of the first and second clock signals by electromagnetic coupling. The first frequency converter is driven by the one of the first and second clock signals transmitted from the first electromagnetic coupler and is configured to convert a first input signal to a first signal with a first frequency corresponding to the one of the first and second clock signals. The second electromagnetic coupler is configured to transmit the first signal by electromagnetic coupling. The second frequency converter is configured to convert the first signal transmitted from the second electromagnetic coupler, to a second signal with a second frequency corresponding to the first input signal, by using the other of the first and second clock signals. The controller is configured to determine a delay amount of the first clock signal at the delay element based on an amplitude of the second signal. The output device is configured to output the second signal.

In the following, embodiments of the present invention are described with reference to accompanying drawings. The disclosure is merely an example, and the invention is not limited by contents described in the following embodiments. Modifications that are easily conceivable by those skilled in the art come within the scope of the disclosure as a matter of course. To make the description clearer, the sizes, the shapes, and the like of the respective portions may be modified from actual embodiments and schematically illustrated in the drawings. In the plurality of drawings, corresponding elements are denoted by the same reference numerals, and detailed description thereof may be omitted unless necessary.

First Embodiment

FIG. 1 is an outline diagram of an electronic circuit 100 according to a first embodiment. The electronic circuit 100 is an amplifier circuit that includes an isolation barrier 110 (illustrated as Isolation in the figure), and transmits an analog signal through the isolation barrier 110. Such an amplifier circuit is also referred to as an isolation amplifier. The electronic circuit 100 further includes a clock generator 101 (illustrated as Clock Generator in the figure), electromagnetic couplers 102a and 102b, frequency converters 103a and 103b (each illustrated as Mix in the figure), a delay element 104 (illustrated as Delay element in the figure), and a buffer 106. The electromagnetic coupler 102a is electromagnetically coupled with the isolation barrier 110, and the electromagnetic coupler 102b is also electromagnetically coupled with the isolation barrier 110.

An input analog signal passing through the electronic circuit 100 until output will be outlined below. An analog signal is input to an input terminal (illustrated as Input in FIG. 1) of the electronic circuit 100. Hereinafter, the analog signal is also referred to as an input signal. For example, the input signal has a waveform at a point A in FIG. 1. The frequency converter 103a is driven by a clock signal generated by the clock generator 101, and converts a frequency of the input signal to generate a high-frequency signal. For example, the high-frequency signal has a waveform at a point B in FIG. 1. The high-frequency signal is transmitted to the frequency converter 103b by the electromagnetic coupling in the electromagnetic coupler 102b. During this transmission, phase shift occurs in the high-frequency signal. For example, the phase-shifted high-frequency signal has a waveform at a point C in FIG. 1. The delay element 104 receives the clock signal generated by the clock generator 101 to delay the phase of the clock signal. The frequency converter 103b converts the frequency based on the phase-delayed clock signal. By inverse conversion of frequency executed by the frequency converter 103b, the high-frequency signal is converted to an analog signal (hereinafter, also referred to as restored signal) that has the restored frequency equivalent to the frequency of the original input signal. For example, the restored signal has a waveform at a point D in FIG. 1. The restored signal is output as an output signal from an output terminal (illustrated as Output in FIG. 1) through the buffer 106. For example, the output signal has a waveform at a point E in FIG. 1.

The electronic circuit 100 transmits and outputs the input signal through isolation according to the behavior described above. In the isolation amplifier, phase shift occurs when the high-frequency signal is transmitted by electromagnetic coupling. If the frequency is inversely converted as is and restored to the frequency equivalent to the frequency of the original input signal, an amplitude of the restored signal may be reduced or the S/N ratio (signal-to-noise ratio) of the restored signal may suffer. The electronic circuit 100 inversely converts the frequency of the phase-shifted high-frequency signal by using the clock signal with the phase delayed by the delay element 104, thereby converting the high-frequency signal to the restored signal with the compensated phase. This makes it possible to reduce influence of the phase shift in the signal caused by electromagnetic coupling transmission, and to reduce lower values of amplitude and S/N ratio in the restored signal. It is noteworthy that the phase delay amount of the clock signal caused by the delay element 104 is determined based on the amplitude value of the restored signal.

Figure 2:
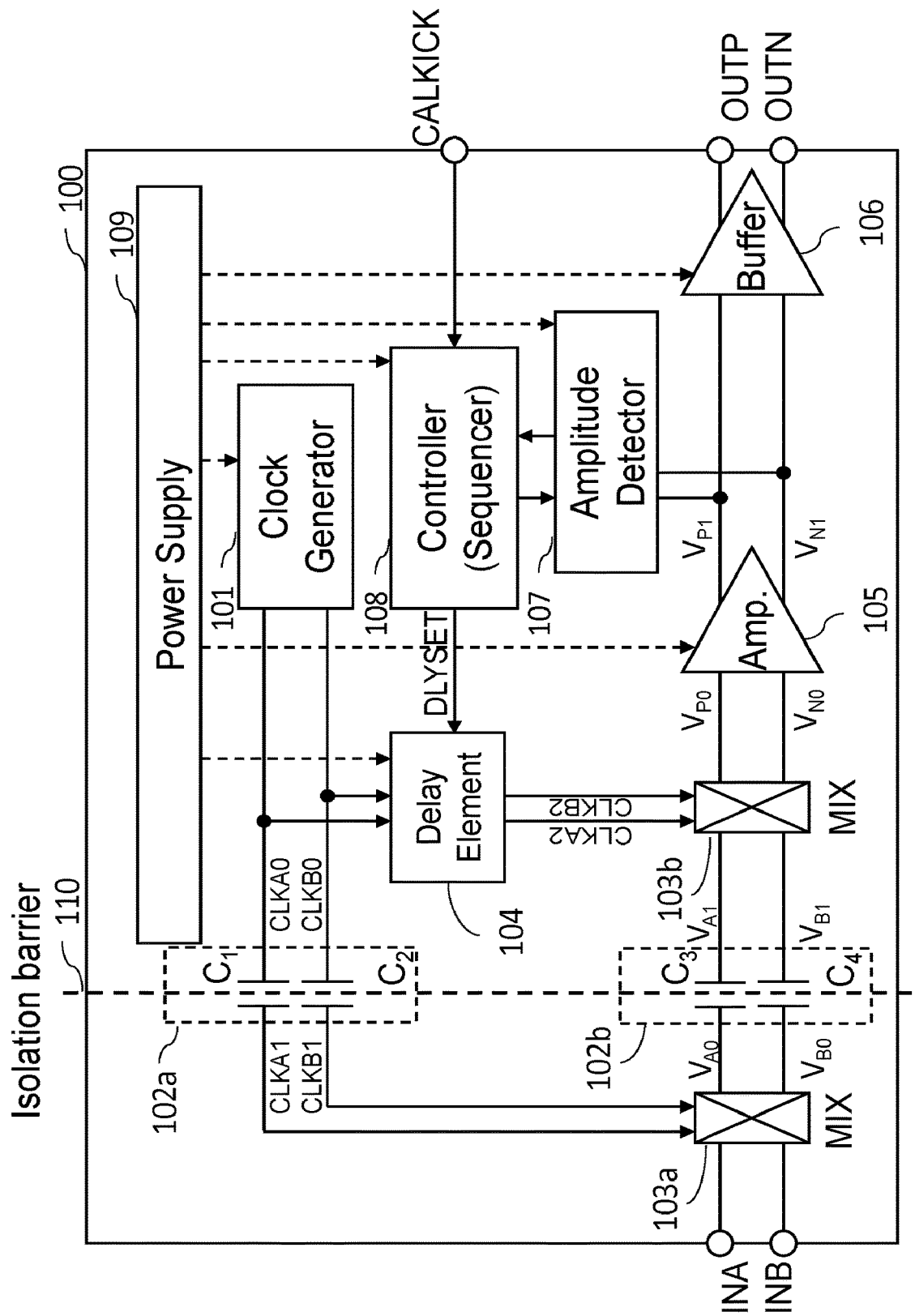
FIG. 2 is a configuration diagram of the electronic circuit 100 according to the first embodiment.

FIG. 2 is a configuration diagram of the electronic circuit 100 according to the first embodiment. The electronic circuit 100 includes an amplifier 105 (illustrated as Amp. in the figure), an amplitude detector 107 (illustrated as Amplitude Detector in the figure), a controller 108 (illustrated as Controller (Sequencer) in the figure), and a power supply 109 (illustrated as Power Supply in the figure), in addition to the clock generator 101, the electromagnetic couplers 102a and 102b, the frequency converters 103a and 103b, the delay element 104, and the buffer 106 (illustrated as Buffer in the figure). The electronic circuit 100 includes the isolation barrier 110 in each of the electromagnetic couplers 102a and 102b. An input terminal INA and INB side of the isolation barrier 110 is referred to as a primary side, and an output terminal OUTP and OUTN side of the isolation barrier 110 is referred to as a secondary side.

The clock generator 101 generates a clock signal. The clock signal can be, for example, a rectangular wave having a high frequency of 100 MHz, and is used by the frequency converters 103a and 103b to convert the frequency of each of the input signal and the high-frequency signal. In the present embodiment, the clock generator 101 generates clock signals CLKA0 and CLKB0, and transmits the clock signals CLKA0 and CLKB0 to the electromagnetic coupler 102a and the delay element 104. In the following, the clock signal CLKB0 is a differential clock signal inverted from the clock signal CLKA0.

The electromagnetic couplers 102a and 102b transmit signals such as the clock signal and the high-frequency signal by electromagnetic coupling. A signal transmission side and a signal reception side in each of the electromagnetic couplers 102a and 102b are isolated electrically. The electromagnetic coupler 102a transmits the clock signals to the frequency converter 103a described below by electromagnetic coupling. The electromagnetic coupler 102b transmits the high-frequency signals to the frequency converter 103b described below by electromagnetic coupling. In the present embodiment, for example, the electromagnetic coupler 102a includes capacitors $C_1$ and $C_2$ by using the isolation barrier 110 as the dielectric substance. In other words, the isolation barrier 110 is provided between a transmission-side flat plate and a reception-side flat plate of each of the capacitors. The electromagnetic coupler 102b includes capacitors $C_3$ and $C_4$ by using the isolation barrier 110 as the dielectric substance. Thus, the isolation barrier 110 is located between a transmission-side flat plate and a reception-side flat plate in each of the capacitors.

Phase shift occurs in the signals transmitted by the electromagnetic couplers 102a and 102b by electromagnetic coupling. In the present embodiment, for example, the clock signals CLKA0 and CLKB0 are transmitted and converted by the electromagnetic coupler 102a, respectively to clock signals CLKA1 and CLKB1. High-frequency signals $V_{A0}$ and $V_{B0}$ converted from the input signals by the frequency converter 103a described below are transmitted and converted by the electromagnetic coupler 102b, respectively to high-frequency signals $V_{A1}$ and $V_{B1}$.

The frequency converters 103a and 103b are driven by the clock signals, and each convert a frequency of a signal such as the input signal and the high-frequency signal. The frequency converter 103a is driven by the clock signals without receiving power from a power supply. Such a frequency converter is also referred to as a passive mixer. The frequency converter 103b may be a passive mixer or a frequency converter that receives power from the power supply 109. In the embodiment, for example, the frequency converter 103b is described as a passive mixer similar to the frequency converter 103a.

In the embodiment, for example, the frequency converter 103a converts the input signals input from the input terminals INA and INB to the high-frequency signals $V_{A0}$ and $V_{B0}$ by the clock signals CLKA1 and CLKB1. The frequency converter 103b converts the high-frequency signals $V_{A1}$ and $V_{B1}$ to restored signals $V_{P0}$ and $V_{N0}$ by clock signals CLKA2 and CLKB2 each with a phase delayed by the delay element 104 described below. The restored signals $V_{P0}$ and $V_{N0}$ are transmitted to the amplifier 105.

The delay element 104 delays a phase of input signal and outputs the resultant signal. The phase delayed by the delay element 104 can be set by the controller 108 described below. In the present embodiment, for example, the delay element 104 has a plurality of predetermined settings including a plurality of delay amounts. The setting used in the delay element 104 can be determined based on a set value DLYSET transmitted from the controller 108. The delay element 104 delays the phase of each of the clock signals CLKA0 and CLKB0 generated by the clock generator 101 to generate the clock signals CLKA2 and CLKB2, and transmits the clock signals CLKA2 and CLKB2 to the frequency converter 103*b*. The clock signals CLKA2 and CLKB2 are used by the frequency converter 103*b* to convert the frequency of the high-frequency signals $V_{A1}$ and $V_{B1}$, compensating the phase shifts.

The amplifier 105 amplifies the signals transmitted from the frequency converter 103*b*, and outputs the resultant signals. In the present embodiment, for example, the amplifier 105 amplifies the restored signals $V_{P0}$ and $V_{N0}$ to generate the restored signals $V_{P1}$ and $V_{N1}$. The restored signals $V_{P1}$ and $V_{N1}$ are output from the buffer 106 described below, and are also transmitted to the amplitude detector 107 described below and are used to detect the amplitude value.

The buffer 106 outputs the restored signals transmitted from the amplifier 105. In the present embodiment, for example, the buffer 106 adjusts the restored signals $V_{P1}$ and $V_{N1}$ transmitted from the amplifier 105, and outputs the resultant signals as output signals from output terminals OUTP and OUTN.

Although not illustrated in FIG. 2, switches are connected between the amplifier 105 and the buffer 106. When the switches are opened (turned off), the restored signals $V_{P1}$ and $V_{N1}$ may not be transmitted to the buffer 106 while the controller 108 described below can determine the delay amount of the delay element 104. The details thereof will be described in below with reference to FIG. 5.

The amplitude detector 107 detects the amplitude of each of the restored signals transmitted from the amplifier 105. The amplitude of each of the restored signals is detected as a voltage. In the present embodiment, for example, the amplitude detector 107 can detect voltages of the restored signals $V_{P1}$ and $V_{N1}$ transmitted from the amplifier 105. The voltages of the restored signals $V_{P1}$ and $V_{N1}$ are transmitted to the controller 108 described below, and are used to determine the phase delay amount of the delay element 104.

The controller 108 determines the phase delay amount of the delay element 104 based on the voltages of the restored signals transmitted from the amplitude detector 107. In the present embodiment, for example, the controller 108 determines the phase delay amount of the delay element 104 based on the voltages of the restored signals $V_{P1}$ and $V_{N1}$ transmitted from the amplitude detector 107, and transmits the set value DLYSET representing the phase delay amount to the delay element 104.

The phase delay amount of the delay element 104 can be determined by the controller 108 at an arbitrary timing. For example, the phase delay amount can be determined at each of the specified timings. Also, a signal to instructing to determine the delay amount can be input to the controller 108. In the embodiment, for example, the controller 108 starts the process of determining the delay amount when a signal CALKICK that instructs to determine the phase delay amount of the delay element 104 is received.

The power supply 109 supplies power to the components in the secondary side of the electronic circuit 100. In the present embodiment, for example, the power supply 109 supplies power to the clock generator 101, the delay element 104, the amplifier 105, the buffer 106, the amplitude detector 107, and the controller 108.

The configuration of the electronic circuit 100 has been described above. The details of the frequency converters 103*a* and 103*b*, the delay element 104, the amplifier 105, the buffer 106, the amplitude detector 107, and the controller 108 will be described below with reference to FIG. 3 to FIG. 6.

Figure 3:
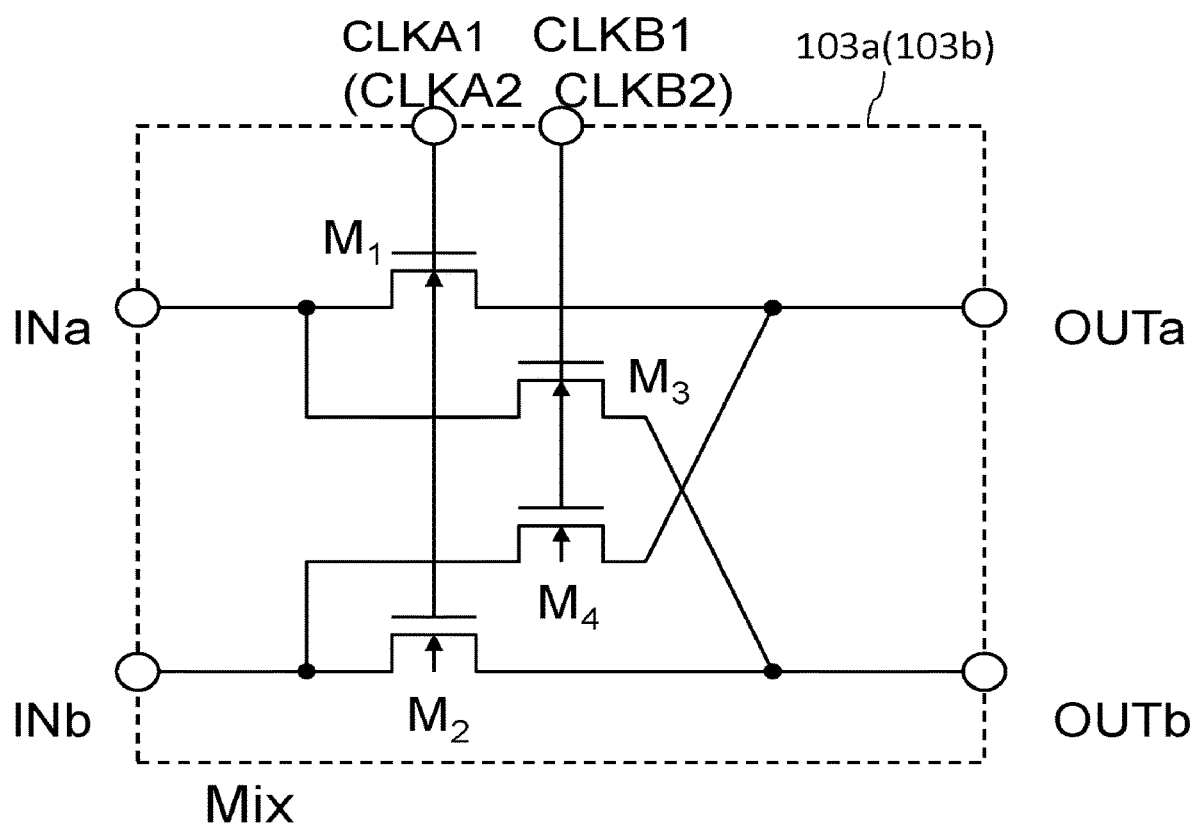
FIG. 3 is a diagram illustrating detail of each of frequency converters 103a and 103b.

FIG. 3 is a diagram illustrating details of each of the frequency converters 103*a* and 103*b*. Each of the frequency converters 103*a* and 103*b* is a mixer that includes four NMOS transistors M1, M2, M3, and M4 (hereinafter, also simply referred to as transistors M1, M2, M3, and M4). The frequency converter 103*a* receives input signals from terminals INa and INb. The frequency converter 103*a* is driven by the clock signals CLKA1 and CLKB1 to convert frequencies of the input signals, and outputs the high-frequency signals $V_{A0}$ and $V_{B0}$ from terminals OUTa and OUTb. The frequency converter 103*b* receives the high-frequency signals $V_{A1}$ and $V_{B1}$ from terminals INa and INb. The frequency converter 103*b* is driven by the clock signals CLKA2 and CLKB2 to convert the frequencies of the high-frequency signals $V_{A1}$ and $V_{B1}$, and outputs the restored signals $V_{P0}$ and $V_{N0}$ from terminals OUTa and OUTb. In other words, since each of the frequency converters 103*a* and 103*b* includes the NMOS transistors, each of the frequency converters 103*a* and 103*b* is a passive mixer driven by input of the clock signals not receiving power from the power supply 109.

The operation of the frequency converter 103*a* will be described below. If the clock signal CLKA1 is HIGH and the clock signal CLKB1 is LOW, the transistors M1 and M2 are turned on, and the transistors M3 and M4 are turned off. Thus, the signal received at the terminal INa is transmitted to the output terminal OUTa, and the signal received at the terminal INb is transmitted to the output terminal OUTb. If the clock signal CLKA1 is LOW and the clock signal CLKB1 is HIGH, the transistors M3 and M4 are turned on, and the transistors M1 and M2 are turned off. Then, the signal received at the terminal INa is transmitted to the output terminal OUTb, and the signal received at the terminal INb is transmitted to the output terminal OUTa. When HIGH and LOW of the clock signals CLKA1 and CLKB1 are switched, the frequency converter 103*a* converts the input signals to the high-frequency signals. Likewise, when HIGH and LOW of the clock signals CLKA2 and CLKB2 are switched, the frequency converter 103*b* converts the high-frequency signals to restored signals with frequencies equivalent to the frequencies of the input signals. The connection for the signals is switched to perform frequency conversion according to the method described above, shifting the pass band of the signals from the input terminals INA and INB to the output terminals OUTP and OUTN to a higher frequency band.

Figure 4:
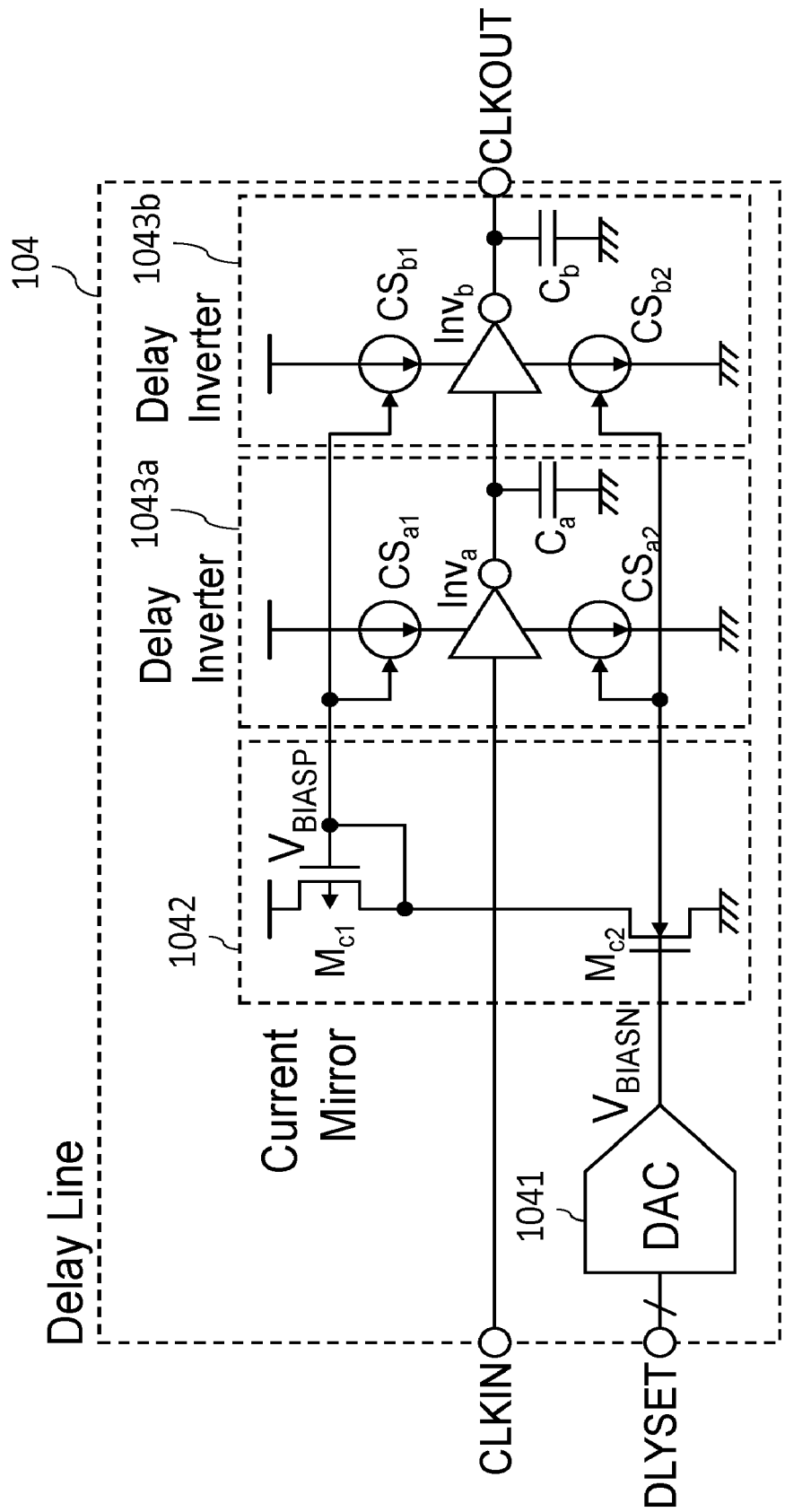
FIG. 4 is a diagram illustrating detail of a delay element 104.

FIG. 4 is a diagram illustrating details of the delay element 104 in FIG. 2. The delay element 104 receives the clock signal generated by the clock generator 101 from the terminal CLKIN, delays the phase of the clock signal, and outputs the resultant signal from the terminal CLKOUT. The delay element 104 includes a digital-to-analog converter 1041 (illustrated as DAC in the figure), a current mirror circuit 1042 (illustrated as Current Mirror in the figure), and delay inverters 1043*a* and 1043*b* (referred to as Delay Inverter in the figure). These components each receive power supply from the power supply 109. It is noteworthy that, for simplification, FIG. 4 illustrates one terminal CLKIN to receive the clock signal and one terminal CLKOUT to transmit the signal; however, the delay element 104 can receive two clock signals CLKA0 and CLKB0, and can transmit the two clock signals CLKA2 and CLKB2.

The digital-to-analog converter 1041 generates a bias voltage $V_{BIASN}$ corresponding to the set value DLYSET transmitted from the controller 108. The current mirror circuit 1042 includes two transistors $M_{C1}$ and $M_{C2}$, and generates a bias voltage $V_{BIASP}$ corresponding to the bias voltage $V_{BIASN}$. In FIG. 4, the current mirror circuit 1042 that has a transistor $M_{C1}$ which is a PMOS transistor and a transistor $M_{C2}$ which is an NMOS transistor is illustrated. Each of the delay inverters 1043a and 1043b is a circuit that delays a signal. The delay inverter 1043a includes current sources $CS_{a1}$ and $CS_{a2}$, an inverter $Inv_a$, and a capacitor $C_a$. The delay inverter 1043b includes current sources $CS_{b1}$ and $CS_{b2}$, an inverter $Inv_b$, and a capacitor $C_b$. A current flows through each of the current sources $CS_{a1}$, $CS_{a2}$, $CS_{b1}$, and $CS_{b2}$ in an arrow direction in FIG. 4.

Operation of the delay element 104 which delays the clock signal will be described below. The delay inverters 1043a and 1043b receive the clock signals CLKA0 and CLKB0. The amount of the current flowing through each of the delay inverters 1043a and 1043b is determined according to the bias voltages $V_{BIASN}$ and $V_{BIASP}$. Accordingly, a time necessary to charge the capacitors $C_a$ and $C_b$ varies depending on magnitudes of the bias voltages $V_{BIASN}$ and $V_{BIASP}$, thereby delaying the clock signals CLKA0 and CLKB0 passing through the inverters $Inv_a$ and $Inv_b$. Further, the delay element 104 includes the current sources $CS_{a1}$, $CS_{a2}$, $CS_{b1}$, and $CS_{b2}$, which makes it possible to delay the clock signals CLKA0 and CLKB0 passing through the inverters $Inv_a$ and $Inv_b$. As described above, the delay element 104 can delay the clock signals CLKA0 and CLKB0 to generate the phase-delayed clock signals CLKA2 and CLKB2.

The delay element 104 illustrated in FIG. 4 is illustrative, and components such as the delay inverters 1043a and 1043b may be optionally added or removed, and the number of delay inverters may be one or three or even greater.

Figure 5:
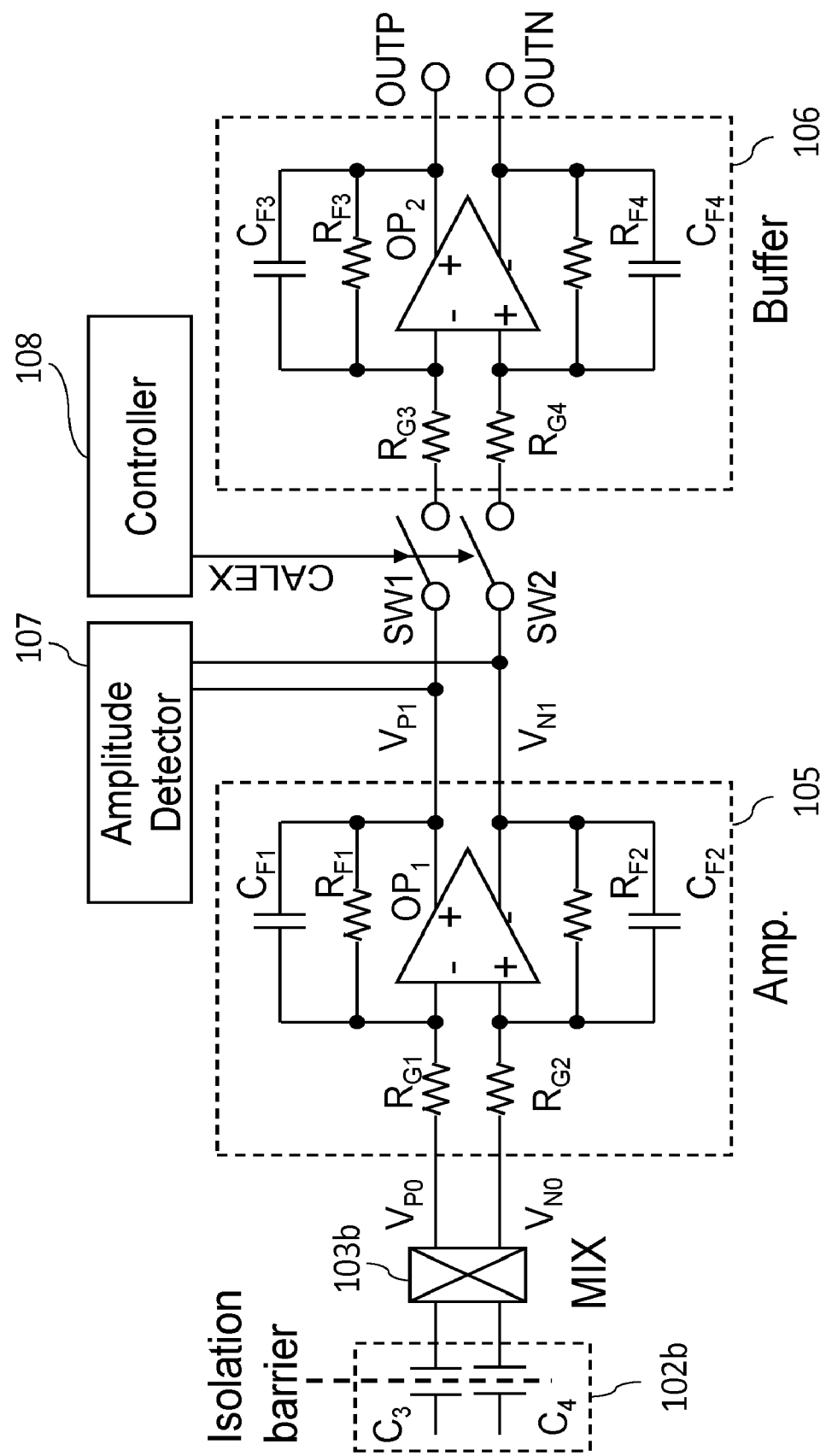
FIG. 5 is a diagram illustrating detail of an amplifier 105 and a buffer 106.

FIG. 5 is a diagram illustrating the details of the amplifier 105 and the buffer 106 illustrated in FIG. 2. The amplifier 105 receives the restored signals $V_{P0}$ and $V_{N0}$, amplifies the restored signals $V_{P0}$ and $V_{N0}$ to generate the restored signals $V_{P1}$ and $V_{N1}$, and outputs the restored signals $V_{P1}$ and $V_{N1}$. The buffer 106 receives the restored signals $V_{P1}$ and $V_{N1}$, and transmits the restored signals $V_{P1}$ and $V_{N1}$ as adjusted output signals to the output terminals OUTP and OUTN. The amplifier 105 includes resistors $R_{G1}$, $R_{G2}$, $R_{F1}$, and $R_{F2}$, capacitors $C_{F1}$ and $C_{F2}$, and an amplifier circuit $OP_1$. The amplifier circuit $OP_1$ receives power supply from the power supply 109. The resistors $R_{G1}$ and $R_{G2}$ are connected in parallel. The resistors $R_{F1}$ and $R_{F2}$, the capacitors $C_{F1}$ and $C_{F2}$, and the amplifier circuit $OP_1$ are also connected in parallel. The resistors $R_{G1}$ and $R_{G2}$ are connected in series with the resistors $R_{F1}$ and $R_{F2}$, the capacitors $C_{F1}$ and $C_{F2}$, and the amplifier circuit $OP_1$. For example, the amplifier circuit $OP_1$ is an operational amplifier. The gain of the amplifier 105 is determined according to the resistance values of the resistors $R_{G1}$, $R_{G2}$, $R_{F1}$, and $R_{F2}$. Furthermore, capacitance values of the capacitors $C_{F1}$ and $C_{F2}$ can be used to form a low-pass filter that does not allow high-frequency components of the signal to pass through. As a result, the amplifier 105 can remove the high-frequency components remaining in the restored signals $V_{P0}$ and $V_{N0}$ transmitted from the frequency converter 103b, and amplifies the restored signals $V_{P0}$ and $V_{N0}$ to generate the restored signals $V_{P1}$ and $V_{N1}$, thereby outputting the restored signals $V_{P1}$ and $V_{N1}$.

The buffer 106 includes resistors $R_{G3}$, $R_{G4}$, $R_{F3}$, and $R_{F4}$, capacitors $C_{F3}$ and $C_{F4}$, and an amplifier circuit $OP_2$, along with the amplifier 105. The amplifier circuit $OP_2$ receives power from the power supply 109. The resistors $R_{G3}$ and $R_{G4}$ are connected in parallel, and the resistors $R_{F3}$ and $R_{F4}$, the capacitors $C_{F3}$ and $C_{F4}$, and the amplifier circuit $OP_2$ are also connected in parallel. The resistors $R_{G3}$ and $R_{G4}$ are connected in series with the resistors $R_{F3}$ and $R_{F4}$, the capacitors $C_{F3}$ and $C_{F4}$, and the amplifier circuit $OP_2$. For example, the amplifier circuit $OP_2$ is an operational amplifier. The gain of the buffer 106 is determined according to resistance values of the resistors $R_{G3}$, $R_{G4}$, $R_{F3}$, and $R_{F4}$. Furthermore, capacitance values of the capacitors $C_{F3}$ and $C_{F4}$ can be used to form a low-pass filter that does not allow the high-frequency components of the signal to pass through. As a result, the buffer 106 can remove the high-frequency components remaining in the restored signals $V_{P1}$ and $V_{N1}$ transmitted from the amplifier 105, and can output the resultant signals to the output terminals OUTP and OUTN.

Furthermore, although not illustrated in FIG. 2, switches SW1 and SW2 are connected between the amplifier 105 and the buffer 106. The switches SW1 and SW2 are opened (turned off) or short-circuited (turned on) based on a signal CALEX from the controller 108. The signal CALEX is a signal for turning on and turning off the switches SW1 and SW2. While the controller 108 determines the phase delay amount in the delay element 104, the switches SW1 and SW2 are opened (turned off) by the signal CALEX, and the restored signals $V_{P1}$ and $V_{N1}$ are transmitted to the amplitude detector 107. In contrast, while the controller 108 does not determine the delay amount, the switches SW1 and SW2 are short-circuited (turned on), the restored signals $V_{P1}$ and $V_{N1}$ are transmitted to the output terminals OUTP and OUTN through the buffer 106.

Figure 6:
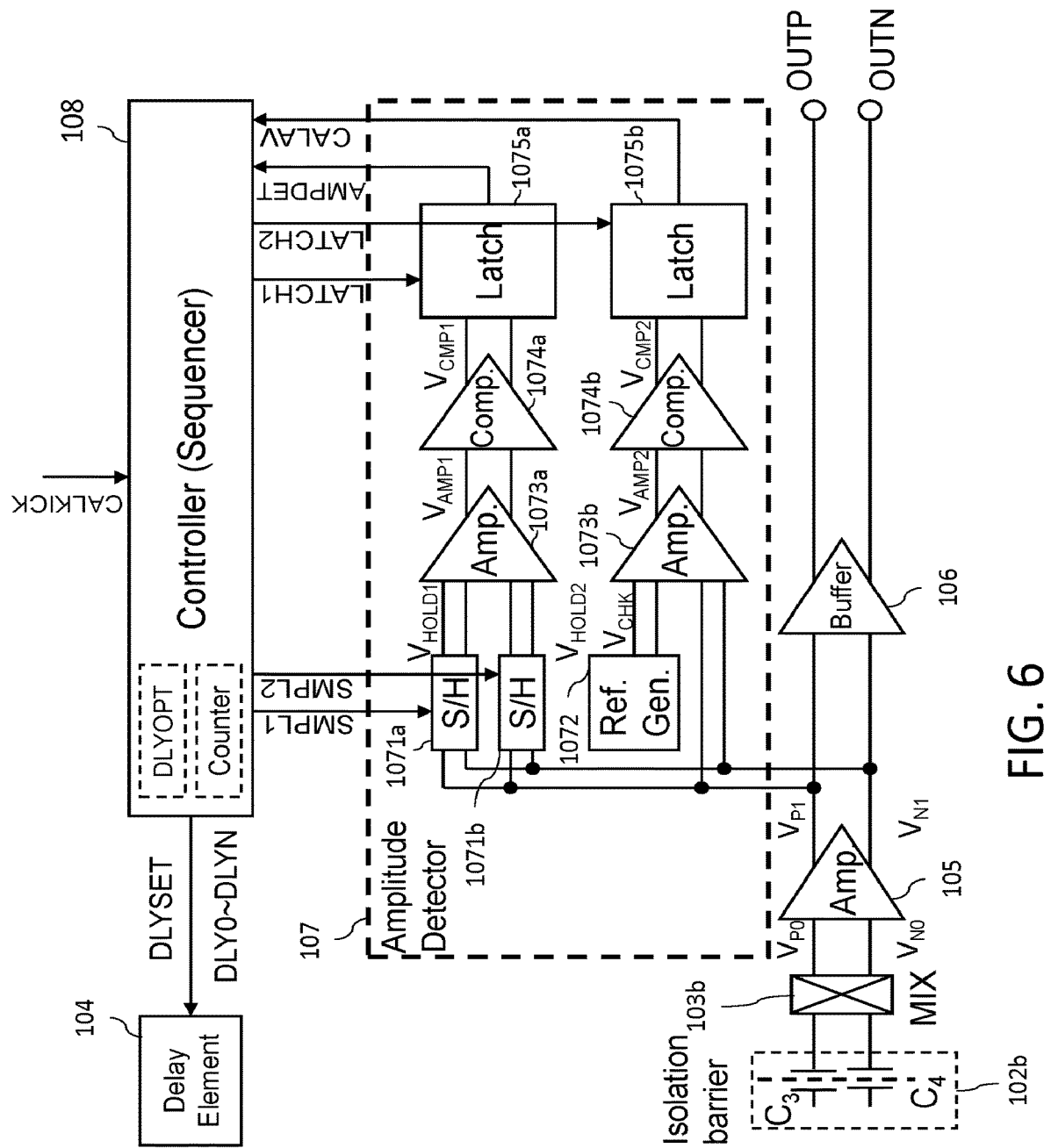
FIG. 6 is a diagram illustrating detail of an amplitude detector 107 and a controller 108.

FIG. 6 is a diagram illustrating the detail of the amplitude detector 107 and the controller 108 in FIG. 2. The amplitude detector 107 detects the amplitudes of the restored signals $V_{P1}$ and $V_{N1}$ as voltages. The controller 108 receives signals relating to the voltages of the restored signals $V_{P1}$ and $V_{N1}$ from the amplitude detector 107, and determines the phase delay amount in the delay element 104. The amplitude detector 107 includes sample-hold circuits 1071a and 1071b (each illustrated as S/H in figure), a reference voltage generator 1072 (illustrated as Ref. Gen. in figure), amplifier circuits 1073a and 1073b, comparator circuits 1074a and 1074b (each illustrated as Comp. in figure), and latch circuits 1075a and 1075b (each illustrated as Latch in figure). These components each receive power from the power supply 109.

Operation of the amplitude detector 107 in a case where the controller 108 determines the phase delay amount of the delay element 104 will be described below. The sample-hold circuit 1071a receives a signal SMPL1 that instructs holding of the voltages from the controller 108, holds the voltages of the restored signals $V_{P1}$ and $V_{N1}$, and transmits the voltages of the restored signals $V_{P1}$ and $V_{N1}$ to the amplifier circuit 1073a. A reference value $V_{HOLD1}$ represents a voltage difference between the restored signals $V_{P1}$ and $V_{N1}$. The sample-hold circuit 1071b receives a signal SMPL2 that instructs holding of the voltages from the controller 108, holds the voltages of the restored signals $V_{P1}$ and $V_{N1}$, and transmits the voltages of the restored signals $V_{P1}$ and $V_{N1}$ to the amplifier circuit 1073a. A reference value $V_{HOLD2}$ represents a voltage difference between the restored signals $V_{P1}$ and $V_{N1}$. It is noteworthy that the set value DLYSET representing the setting of the phase delay of the delay element 104 is different between timing when the controller 108 transmits the signal SMPL1 and timing when the controller 108 transmits the signal SMPL2, for some of the cases.

The amplifier circuit 1073a amplifies the input voltages, and outputs the amplified voltages to the comparator circuit 1074a. A reference value $V_{AMP1}$ represents a voltage difference between two lines between the amplifier circuit 1073a and the comparator circuit 1074a. The comparator circuit 1074a determines positive/negative of the input voltage difference $V_{AMP1}$, and transmits a signal $V_{CMP1}$ indicating a comparison result to the latch circuit 1075a. The latch circuit 1075a digitalizes the signal in response to a signal LATCH1 that is input from the controller 108 and instructs digitalization of the signal, and transmits a signal AMPDET to the controller 108. The signal AMPDET represents a line which has the higher voltage out of the two lines connected between the comparator circuit 1074a and the latch circuit 1075a. The controller 108 can compare the value of the voltage difference $V_{HOLD1}$ and the value of the voltage difference $V_{HOLD2}$ based on the signal AMPDET.

The reference voltage generator 1072 generates voltages that are different from each other by a voltage difference $V_{CHK}$, of the two lines connected to the amplifier circuit 1073b, and transmits the voltages to the amplifier circuit 1073b. In the following, the voltage difference $V_{CHK}$ is also referred to as a reference voltage difference $V_{CHK}$. Furthermore, the restored signals $V_{P1}$ and $V_{N1}$ are transmitted to the amplifier circuit 1073b. The amplifier circuit 1073b amplifies the input voltages, and outputs the amplified voltages to the comparator circuit 1074b. A reference value $V_{AMP2}$ represents difference between voltages of the two lines connected from the amplifier circuit 1073b to the comparator circuit 1074b. The comparator circuit 1074b determines positive/negative of the input voltage difference $V_{AMP2}$, and transmits a signal $V_{CMP2}$ representing a comparison result to the latch circuit 1075b. The latch circuit 1075b digitalizes the signal in response to a signal LATCH2 that is input from the controller 108 and instructs digitalization of the signal, and transmits a signal CALAV to the controller 108. The signal CALAV indicates a line having higher voltage out of the two lines between the comparator circuit 1074b and the latch circuit 1075b. The controller 108 can compare value of the voltage difference of the restored signals $V_{P1}$ and $V_{N1}$ and the value of the reference voltage difference $V_{CHK}$ based on the signal CALAV.

Figure 7:
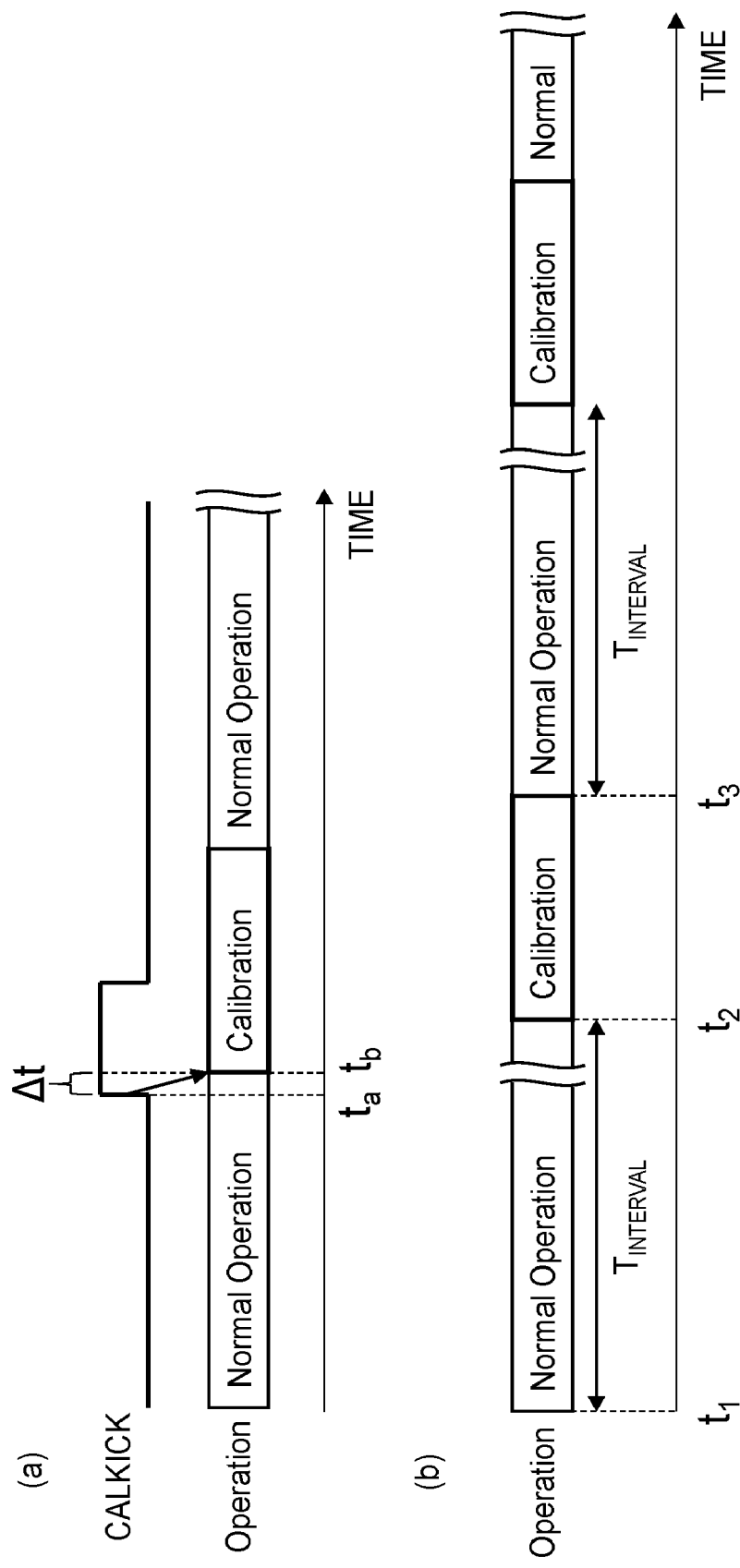
FIG. 7 is a diagram illustrating an operation state of the electronic circuit 100.

The controller 108 determines the phase delay amount of the delay element 104 based on the signal AMPDET and the signal CALAV. The details thereof will be described below. Furthermore, in this embodiment, for example, the controller 108 starts the determination (calibration) of the phase delay amount of the delay element 104 in response to input of the signal CALKICK. The timing chart (a) in FIG. 7 illustrates relation with respect to time for this process. In the timing chart (a) of FIG. 7, a reference sign CALKICK represents the input state of the signal CALKICK with the time, and the reference sign Operation represents the operation state of the electronic circuit 100.

The Normal operation process represents a state where the controller 108 does not determine the phase delay amount of the delay element 104, and outputs the input signal as the output signal. In other words, the delay element 104 delays the clock signals CLKA0 and CLKB0 by the set delay amount. The frequency converter 103b converts the high-frequency signals $V_{A1}$ and $V_{B1}$ respectively to the restored signals $V_{P0}$ and $V_{N0}$. The amplifier 105 amplifies the restored signals $V_{P0}$ and $V_{N0}$ to generate the restored signals $V_{P1}$ and $V_{N1}$, and outputs the restored signals $V_{P1}$ and $V_{N1}$. The buffer 106 outputs the restored signals $V_{P1}$ and $V_{N1}$ as the output signals from the terminals OUTP and OUTN.

Calibration process represents a process where the controller 108 determines the phase delay amount of the delay element 104. In this process, the restored signals $V_{P1}$ and $V_{N1}$ are not transmitted to the buffer 106, and instead, are transmitted to the amplitude detector 107. The amplitude detector 107 detects voltages of the restored signals $V_{P1}$ and $V_{N1}$, and transmits the signals AMPDET and CALAV to the controller 108. The controller 108 determines the phase delay amount of the delay element 104 based on the signals AMPDET and CALAV.

For example, in the timing chart (a) of FIG. 7, the electronic circuit 100 executes the normal operation process until the signal CALKICK is provided to the input. When the signal CALKICK is turned on at time $t_a$, and the signal CALKICK is transmitted to the controller 108 at time $t_b$, the controller 108 determines the phase delay amount of the delay element 104. After the controller 108 determines the phase delay amount of the delay element 104, the operation of the electronic circuit 100 returns to the normal operation process again.

As illustrated in the timing chart (b) of FIG. 7, the controller 108 can perform the calibration process every preset time period $T_{INTERVAL}$. In the timing chart (b) of FIG. 7, as an example, the electronic circuit 100 performs the normal operation process during the period $T_{INTERVAL}$ from time $t_1$, and performs the calibration process from the time $t_2$. The electronic circuit 100 performs the normal operation process again during the period $T_{INTERVAL}$ from time $t_3$ when the calibration process ends. Thereafter, the operation process can be repeated. Measurement of the period $T_{INTERVAL}$ can be performed by an optional counter. As an example, In FIG. 6, a counter (illustrated as Counter in figure) is included inside the controller 108.

Figure 8:
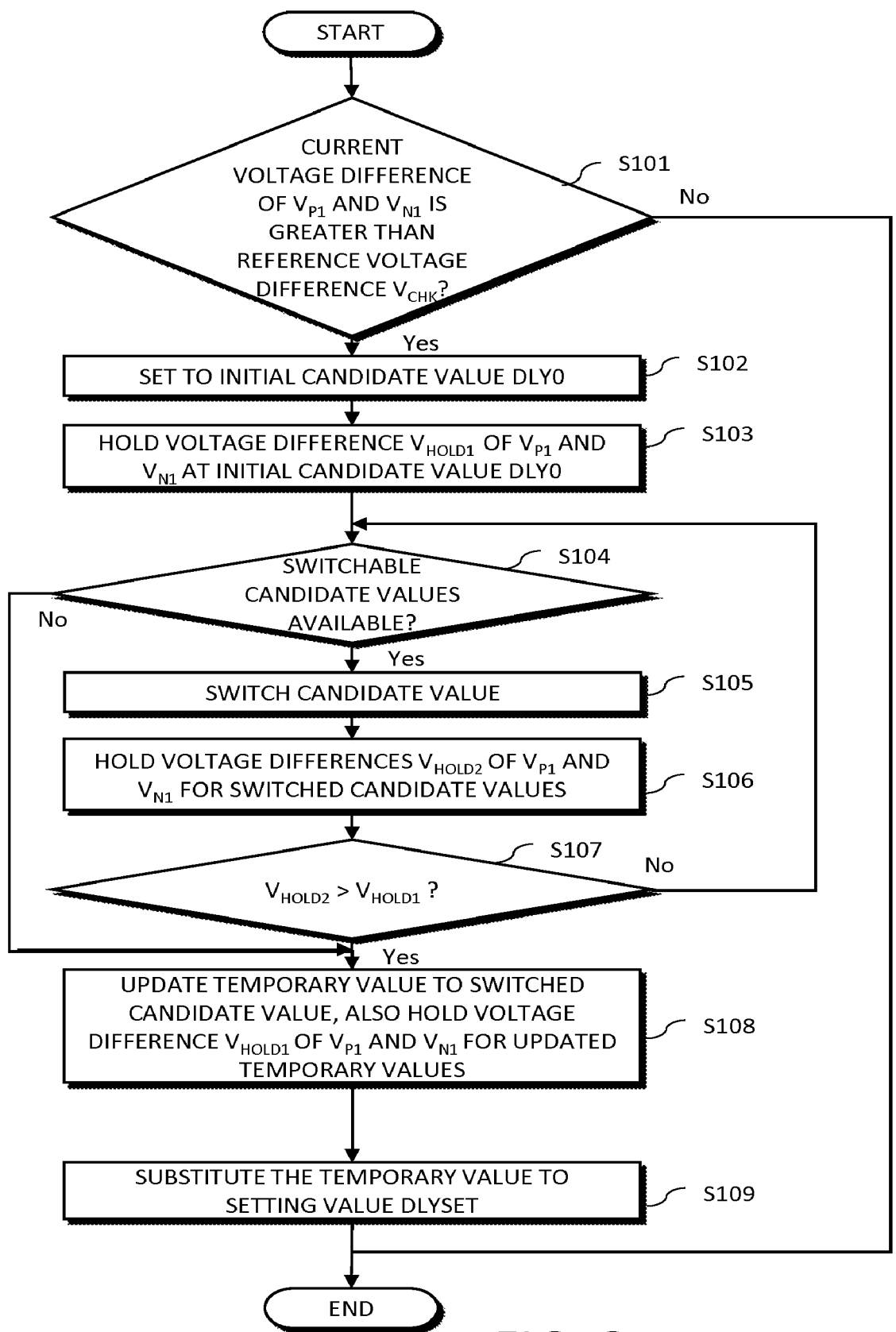
FIG. 8 is a flowchart of operation by the amplitude detector 107 and the controller 108 If a delay amount of the delay element 104 is determined.

The operation executed by the amplitude detector 107 and the controller 108 during the calibration process is described below. FIG. 8 is a flowchart of the operation executed by the amplitude detector 107 and the controller 108. The controller 108 determines the delay amount of the delay element 104 by determining the set value DLYSET. In this flowchart, generation of the clock signals, frequency conversion from the input signals to the high-frequency signals, transmission of the clock signals and the high-frequency signals through electromagnetic coupling, and frequency conversion from the high-frequency signals to the restored signals are performed accordingly.

Figure 9:
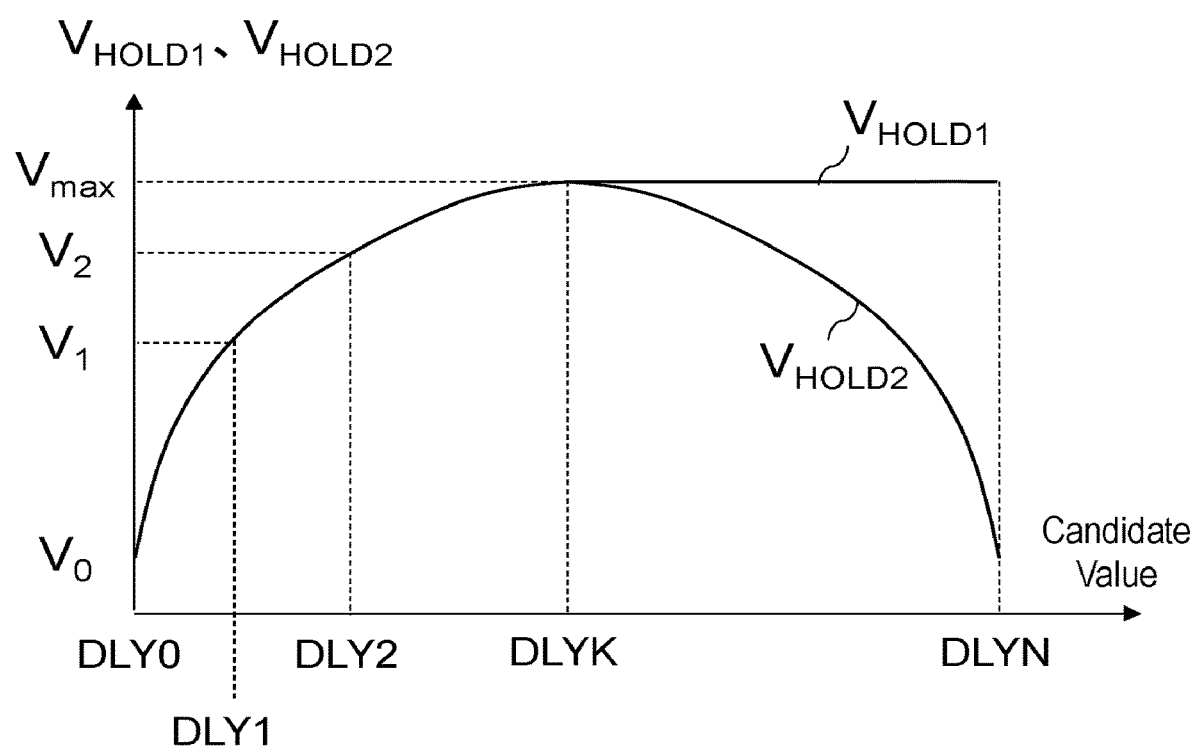
FIG. 9 is a diagram illustrating exemplary relationship between a candidate value of the delay element 104 and voltage differences $V_{HOLD1}$ and $V_{HOLD2}$.

The controller 108 includes N+1 (N is integer equal to 1 or greater) predetermined candidate values DLY0 to DLYN with different phase delay amounts for the delay element 104. The controller 108 transmits these candidate values to the delay element 104, one by one during the period of calibration, thereby evaluating the voltages of the restored signals $V_{P1}$ and $V_{N1}$. The controller 108 evaluates the voltages of the restored signals $V_{P1}$ and $V_{N1}$ for each candidate value, thereby selecting either of the plurality of candidate values as the set value DLYSET. In this embodiment, for example, the delay amount is increased in order of; the candidate value DLY0 to the candidate value DLYN. The controller 108 switches the candidate values from DLY0 to DLYN, and determines the candidate value the voltage differences between $V_{HOLD1}$ and $V_{HOLD2}$ takes the maximum value, as the set value DLYSET. Here, $V_{HOLD1}$ and $V_{HOLD2}$ each represent the amplitude of the restored signal. In this embodiment, for example, FIG. 9 illustrates the relationship between the delay setting and the voltage differences $V_{HOLD1}$ and $V_{HOLD2}$. In this case, the voltage differences $V_{HOLD1}$ and $V_{HOLD2}$ each take maximum values $V_{max}$ at the candidate value DLYK. Therefore, the controller 108 selects the candidate value DLYK as the set value DLYSET.

In the amplitude detector 107, the voltage difference of the restored signals $V_{P1}$ and $V_{N1}$ and the reference voltage difference $V_{CHK}$ generated by the reference voltage generator 1072 are output as the voltage difference $V_{AMP2}$ from the amplifier circuit 1073*b*. Positive/negative (polarity) of the voltage difference $V_{AMP2}$ is determined by the comparator circuit 1074*b*, and a signal $V_{CMP2}$ indicating the comparison result is provided as the output. The signal $V_{CMP2}$ is digitalized by the latch circuit 1075*b*, and the signal CALAV is output to the controller 108. The controller 108 can determine whether the voltage difference of the restored signals $V_{P1}$, $V_{N1}$ is greater than the reference voltage difference $V_{CHK}$ based on the signal CALAV (step S101).

If the voltage difference of the restored signals $V_{P1}$ and $V_{N1}$ is smaller than the reference voltage difference $V_{CHK}$ (No in step S101), the process of the flowchart ends. This is because the case when the voltage difference of the restored signals $V_{P1}$ and $V_{N1}$ is smaller than the reference voltage difference $V_{CHK}$ is not desired for determining the phase delay amount of the delay element 104.

In contrast, if the voltage difference of the restored signals $V_{P1}$ and $V_{N1}$ is greater than the reference voltage difference $V_{CHK}$ (Yes in step S101), the controller 108 sets the candidate value in this timing as the initial candidate value (step S102). In the embodiment, for example, the controller 108 sets the candidate value DLY0. Thereafter, each of the candidate values DLY0 to DLYN set or switched by the controller 108 is transmitted to the delay element 104 accordingly, and the delay element 104 sets the delay amount depending on the transmitted candidate values DLY0 to DLYN.

The controller 108 transmits the signal SMPL1 to the sample-hold circuit 1071*a*, and causes the sample-hold circuit 1071*a* to hold the voltage difference $V_{HOLD1}$ at the candidate value DLY0 (step S103). The controller 108 checks whether switchable candidate values are available (step S104). In the embodiment, as an example, the candidate value is switched one by one in order of candidate values DLY0, DLY1, DLY2, . . . , and DLYN. If the controller 108 has switched the candidate value to the final candidate value DLYN, and no switchable candidate values are available in step S104 (No in step S104), the process proceeds to step S109.

In contrast, if a switchable candidate values are available (Yes in step S104), the controller 108 switches (updates) the candidate value (step S105). In the embodiment, the candidate value is switched one by one in order of candidate values DLY0, DLY1, DLY2, . . . , and DLYN. The switched candidate value is transmitted to the delay element 104, and the delay element 104 sets the delay amount corresponding to the transmitted candidate value. For example, if the candidate value is switched to the candidate value DLY1, the delay element 104 switches the delay amount to a delay amount corresponding to the candidate value DLY1.

The controller 108 transmits the signal SMPL2 to the sample-hold circuit 1071*b*, and causes the sample-hold circuit 1071*b* to hold the voltage difference $V_{HOLD2}$ at the candidate value switched in step S105 (step S106). For example, if the candidate value is switched to the candidate value DLY1 in step S105, the sample-hold circuit 1071*b* holds the voltage difference $V_{HOLD2}$. In the amplitude detector 107, the voltage differences $V_{HOLD1}$ and $V_{HOLD2}$ at the candidate value DLY1 are output as the voltage difference $V_{AMP1}$ from the amplifier circuit 1073*a*. Positive/negative of the voltage difference $V_{AMP1}$ can be determined by the comparator circuit 1074*a*, and the signal $V_{CMP1}$ indicating a comparison result is output. The signal $V_{CMP1}$ is digitalized by the latch circuit 1075*a*, and the signal AMPDET is output to the controller 108. The controller 108 can determine whether the value of the voltage difference $V_{HOLD1}$ is greater than $V_{HOLD2}$ based on the signal AMPDET (step S107). If the voltage difference $V_{HOLD2}$ is smaller than the voltage difference $V_{HOLD1}$ (No in step S107), the process returns to step S104.

In contrast, if the voltage difference $V_{HOLD2}$ is greater than the voltage difference $V_{HOLD1}$ (Yes in step S107), the controller 108 holds the candidate value switched in step S105 as a temporary value in the internal storage (illustrated as DLYOPT in figure). For example, if the candidate value is switched to the candidate value DLY1 in step S105, the controller 108 holds the candidate value DLY1. The temporary value is the candidate value when the voltage difference $V_{HOLD2}$ takes the maximum value in step S108. Furthermore, the controller 108 transmits the signal SMPL1 to the sample-hold circuit 1071*a*, and causes the sample-hold circuit 1071*a* to hold the voltage difference $V_{HOLD1}$ at the updated temporary value, namely, at the candidate value switched in step S105 (step S108). For example, if the candidate value is switched to the candidate value DLY1 in step S105, the sample-hold circuit 1071*a* holds the voltage difference $V_{HOLD1}$. After step S108, the process returns to step S104.

The values of the voltage differences $V_{HOLD1}$ and $V_{HOLD2}$ are compared while the candidate values DLY0 to DLYN are switched and the temporary value is updated according to the method described above. If no switchable candidate values are available (No in step S104), the controller 108 substitutes the temporary value to the set value DLYSET (step S109). The temporary value is the set value DLYSET that maximizes the voltage difference $V_{HOLD2}$. For example, in FIG. 9, the candidate value DLYK becomes the set value DLYSET. The controller 108 sets the temporary value as the set value DLYSET, which makes it possible to convert the signals to the restored signals $V_{P1}$ and $V_{N1}$ having the phase shift caused by electromagnetic coupling compensated.

The controller 108 determines the set value DLYSET that maximizes the voltage difference $V_{HOLD2}$ according to the process above, and the calibration process finishes. The set value DLYSET is transmitted to the delay element 104. The delay element 104 changes the delay amount to a delay amount corresponding to the set value DLYSET.

A series of flow in which the controller 108 compares the values of the voltage differences $V_{HOLD1}$ and $V_{HOLD2}$ and updates the temporary value while switching the candidate value is described with reference to FIG. 9, as an example. As described in step S102, the initial candidate value is DLY0. The voltage difference $V_{HOLD1}$ held in step S103 is $V_0$. When the controller 108 switches the candidate value to the candidate value DLY1, the voltage difference $V_{HOLD2}$ held in step S106 is $V_1$. Since the voltage difference $V_{HOLD2}$ is greater than the voltage difference $V_{HOLD1}$ the controller 108 holds the candidate value DLY1 as the temporary value. The sample-hold circuit 1071*a* newly holds $V_1$ as the voltage difference $V_{HOLD1}$. The process returns from step S108 to step S104. Thereafter, the controller 108 similarly switches the candidate value, holds the voltage difference $V_{HOLD2}$, and compares the voltage difference $V_{HOLD2}$ with the voltage difference $V_{HOLD1}$ until the candidate value reaches the candidate value DLYN. If the voltage difference $V_{HOLD2}$ is greater than the voltage difference $V_{HOLD1}$, the controller 108 updates the candidate value as the temporary value, and the sample-hold circuit 1071*a* holds the voltage difference $V_{HOLD1}$ in the updated temporary value.

In the embodiment, the voltage difference $V_{HOLD1}$ in the candidate value DLYK takes the maximum value $V_{max}$. Accordingly, after the controller 108 switches the candidate value up to the candidate value DLYN, holds the voltage difference $V_{HOLD2}$, and compares the voltage difference $V_{HOLD2}$ with the voltage difference $V_{HOLD1}$ ($V_{max}$), the controller 108 determines the temporary value, namely, the candidate value DLYK to the set value DLYSET, and the calibration process then finishes. In the succeeding process, the set value DLYSET transmitted to the delay element 104 is the candidate value DLYK.

Although the embodiment has been described in above, various modifications can be executed and implemented. The modifications of the configuration and the operation according to the embodiment will be described below.

(First Variation)

In the embodiment, the controller 108 compares the voltage differences $V_{HOLD1}$ and $V_{HOLD2}$ for all of the candidate values; however, process of comparison can be skipped for some of the candidate values. For example, in the example of FIG. 9, the voltage difference $V_{HOLD1}$ is updated using the voltage value $V_{max}$ at the candidate value DLYK. If the voltage difference $V_{HOLD2}$ is smaller than the voltage difference $V_{HOLD1}$ ($V_{max}$) for the candidate values DLYK+a ("a" is optional natural number set by controller 108) consecutively, the operation for the succeeding candidate values can be skipped. This makes it possible to determine the delay amount of the delay element 104 while reducing the workload in the controller 108.

Furthermore, the controller 108 according to the embodiment switches the candidate value from DLY0 to DLYN, and determines the candidate value when the voltage differences $V_{HOLD1}$ and $V_{HOLD2}$ each representing the amplitude of the restored signal takes the maximum values, as the set value DLYSET. The controller 108 may select the candidate value other than the candidate value when the voltage differences $V_{HOLD1}$ and $V_{HOLD2}$ takes the maximum value, as the set value DLYSET. For example, the controller 108 may select the set value DLYSET from the candidate values when the voltage differences $V_{HOLD1}$ and $V_{HOLD2}$ are greater than the preset values. Moreover, each of the voltage differences $V_{HOLD1}$ and $V_{HOLD2}$ can be an absolute value.

(Second Variation)

In the embodiment, the controller 108 holds the temporary value in the internal storage; however, the configuration of the storage is not limited. The storage can be provided outside the controller 108 and connected to the controller 108. An arbitrary type of storage can be used, as long as the storage can hold the temporary value, and examples of the storage include a RAM (random access memory), a ROM (read-only memory), a PROM (programmable ROM), an EPROM (erasable PROM), an EEPROM (electrically EPROM), a flash memory, and a register.

(Third Variation)

Figure 10:
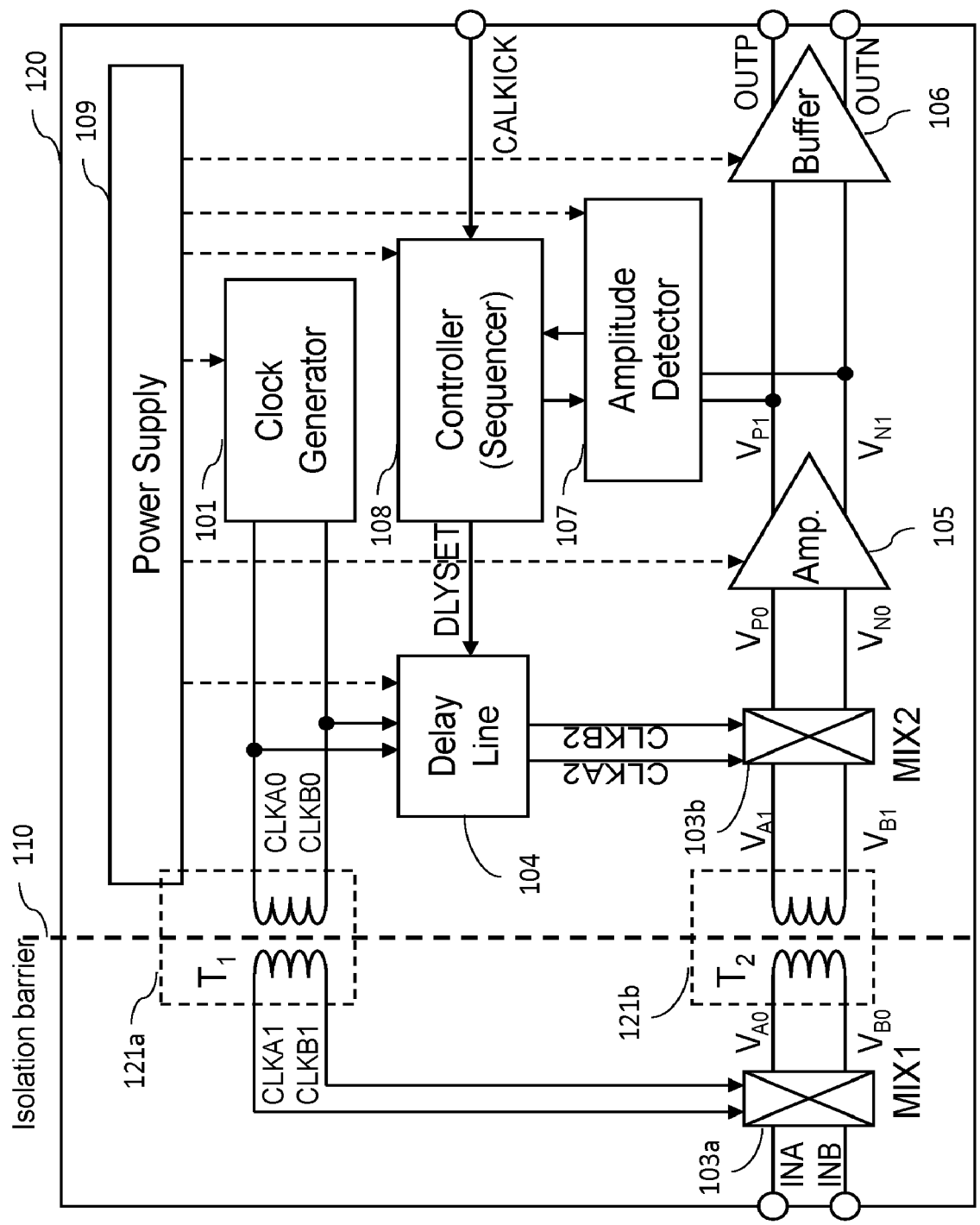
FIG. 10 is a configuration diagram of an electronic circuit 120 applicable to the first embodiment.

In the embodiment, the electromagnetic couplers 102a and 102b are capacitors; however, the electromagnetic couplers 102a and 102b can be transformers. FIG. 10 illustrates an electronic circuit 120 with such a configuration. The electronic circuit 120 includes electromagnetic couplers 121a and 121b. The electromagnetic couplers 121a and 121b are transformers and are each coupled electromagnetically by a coil. This makes it possible to improve the S/N ratio of the restored signals. Further, the electromagnetic couplers may be each include a combination of a capacitor and a transformer.

(Fourth Variation)

Figure 11:
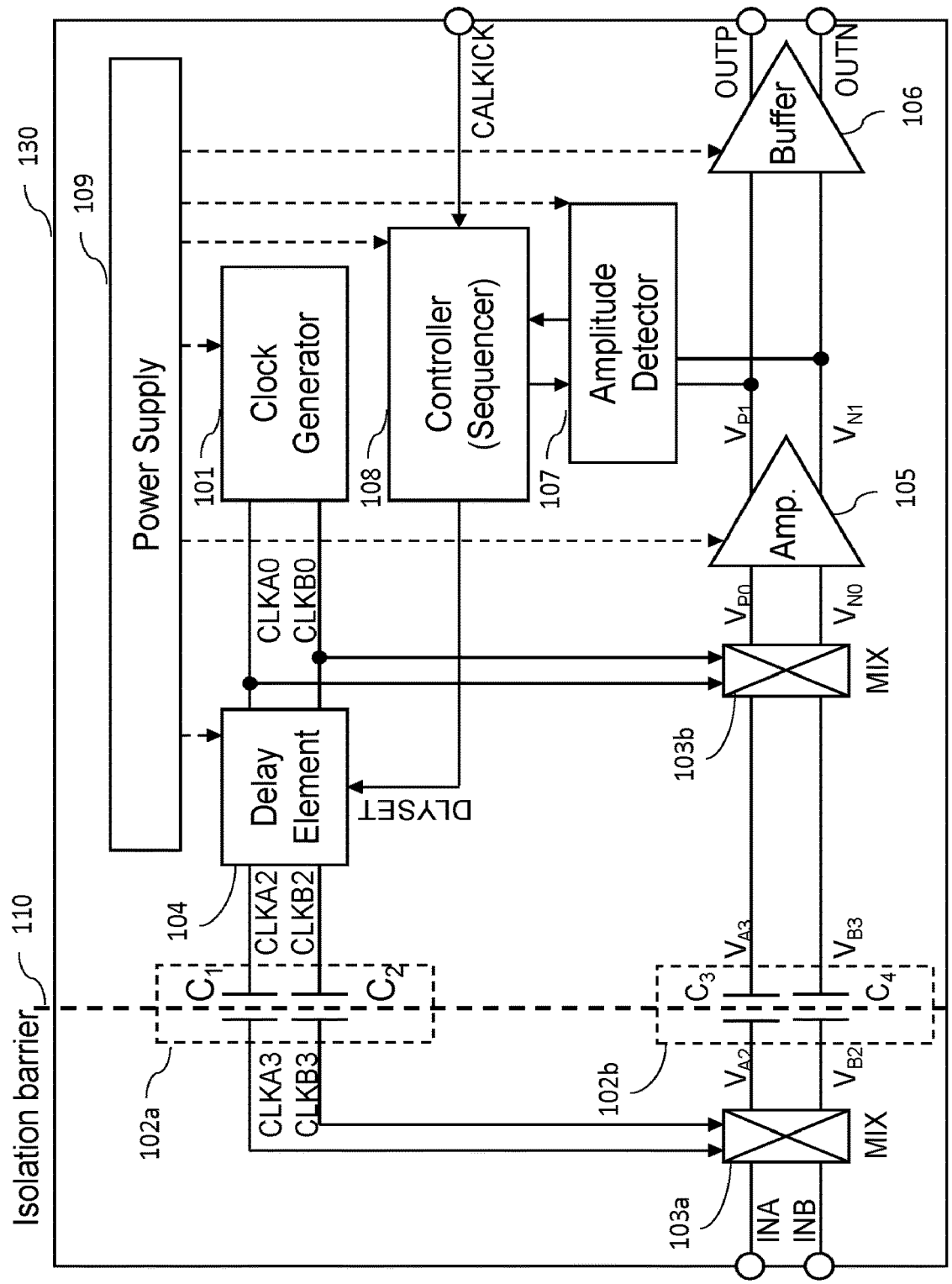
FIG. 11 is a configuration diagram of an electronic circuit 130 applicable to the first embodiment.

In the embodiment, the delay element 104 delays the phase of each of the clock signals CLKA0 and CLKB0 and outputs the resultant signals to the frequency converter 103b; however, the delay element 104 may output the resultant signals to the electromagnetic coupler 102a. FIG. 11 illustrates an electronic circuit 130 having such a configuration. In this case, the electromagnetic coupler 102a transmits the clock signals CLKA2 and CLKB2 with the phase by the delay element 104, to the frequency converter 103a by electromagnetic coupling. As a result of transmission, clock signals CLKA3 and CLKB3 are input to the frequency converter 103a. The frequency converter 103a is driven by the clock signals CLKA3 and CLKB3, and converts the input signals to high-frequency signals $V_{A2}$ and $V_{B2}$. The electromagnetic coupler 102b transmits the high-frequency signals $V_{A2}$ and $V_{B2}$ by electromagnetic coupling. By transmission, high-frequency signals $V_{A3}$ and $V_{B3}$ are input to the frequency converter 103b. The frequency converter 103b converts the high-frequency signals $V_{A3}$ and $V_{B3}$ to the restored signals $V_{PO}$ and $V_{NO}$ by using the clock signals CLKA0 and CLKB0 transmitted from the clock generator 101. The operation executed beyond is similar to the operation according to the present embodiment.

Even when the delay element 104 is disposed between the clock generator 101 and the electromagnetic coupler 102a, the electronic circuit 100 can perform conversion into the restored signals. In restored signals, the phase shift caused by the electromagnetic couplers 102a and 102b is compensated.

The variations of the configuration and the operation of the electronic circuit 100 have been described above. Various arrangement examples of the electronic circuit 100 on a chip are possible. The arrangement examples will be described below.

ARRANGEMENT EXAMPLE 1

Figure 12:
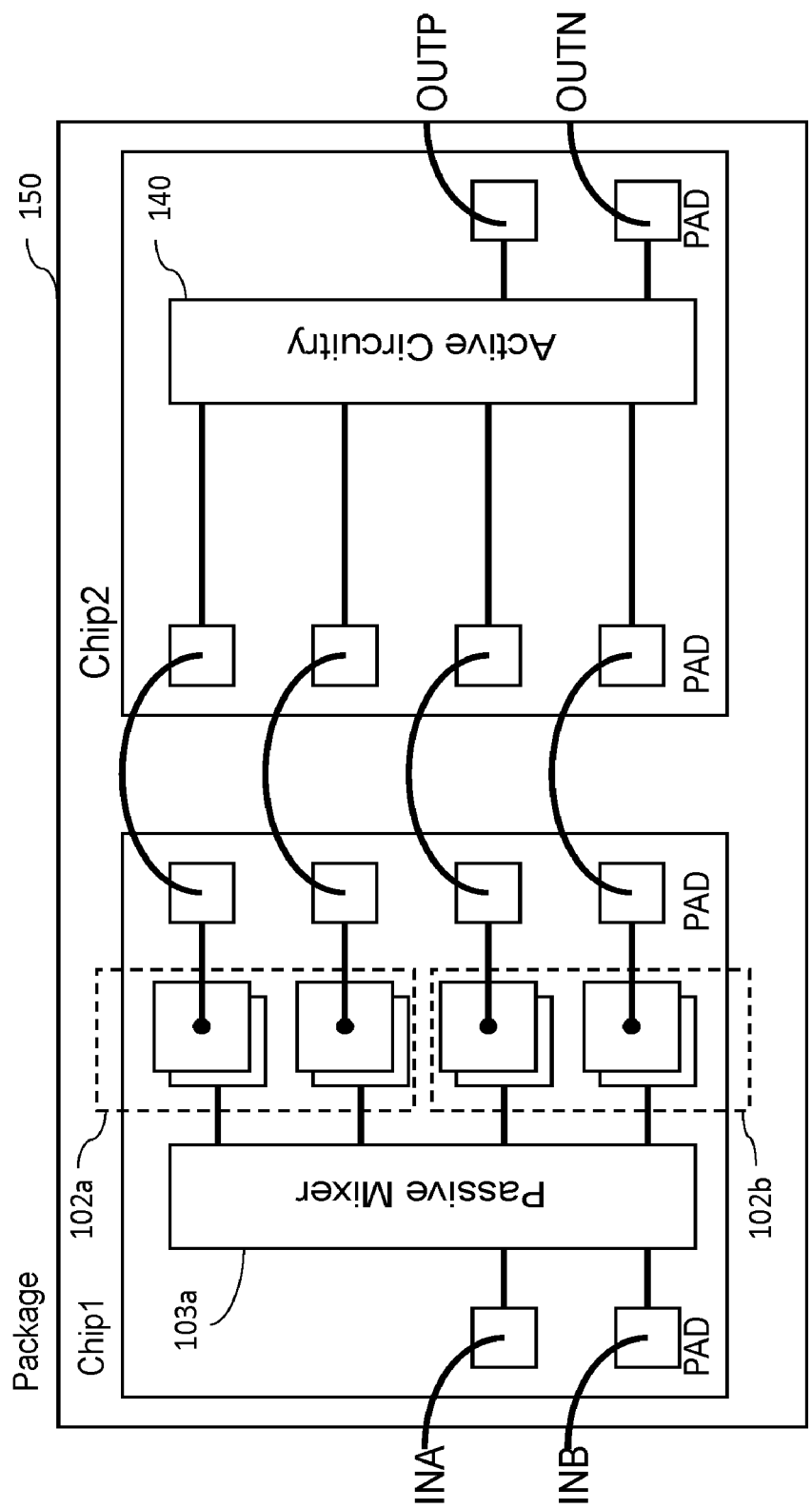
FIG. 12 is an arrangement example of an electronic circuit 150 applicable to the first embodiment.

FIG. 12 illustrates an electronic circuit 150 where the electromagnetic couplers 102a and 102b and the frequency converter 103a are implemented on a single chip, and the other components are implemented on a different chip. The electromagnetic couplers 102a and 102b and the frequency converter 103a (illustrated as Passive Mixer in figure) are implemented on a single chip (Chip1). An active circuitry 140 (illustrated as Active Circuitry in figure) is disposed on another chip (Chip2). The active circuitry 140 at least includes the frequency converter 103b, and components implemented in the secondary side among the components of the electronic circuit 100. For example, the active circuitry 140 includes the clock generator 101, the frequency converter 103b, the amplifier 105, the buffer 106, the amplitude detector 107, the controller 108, and the power supply 109. In addition, a part of the active circuitry 140 can be implemented in other different chips.

ARRANGEMENT EXAMPLE 2

Figure 13:
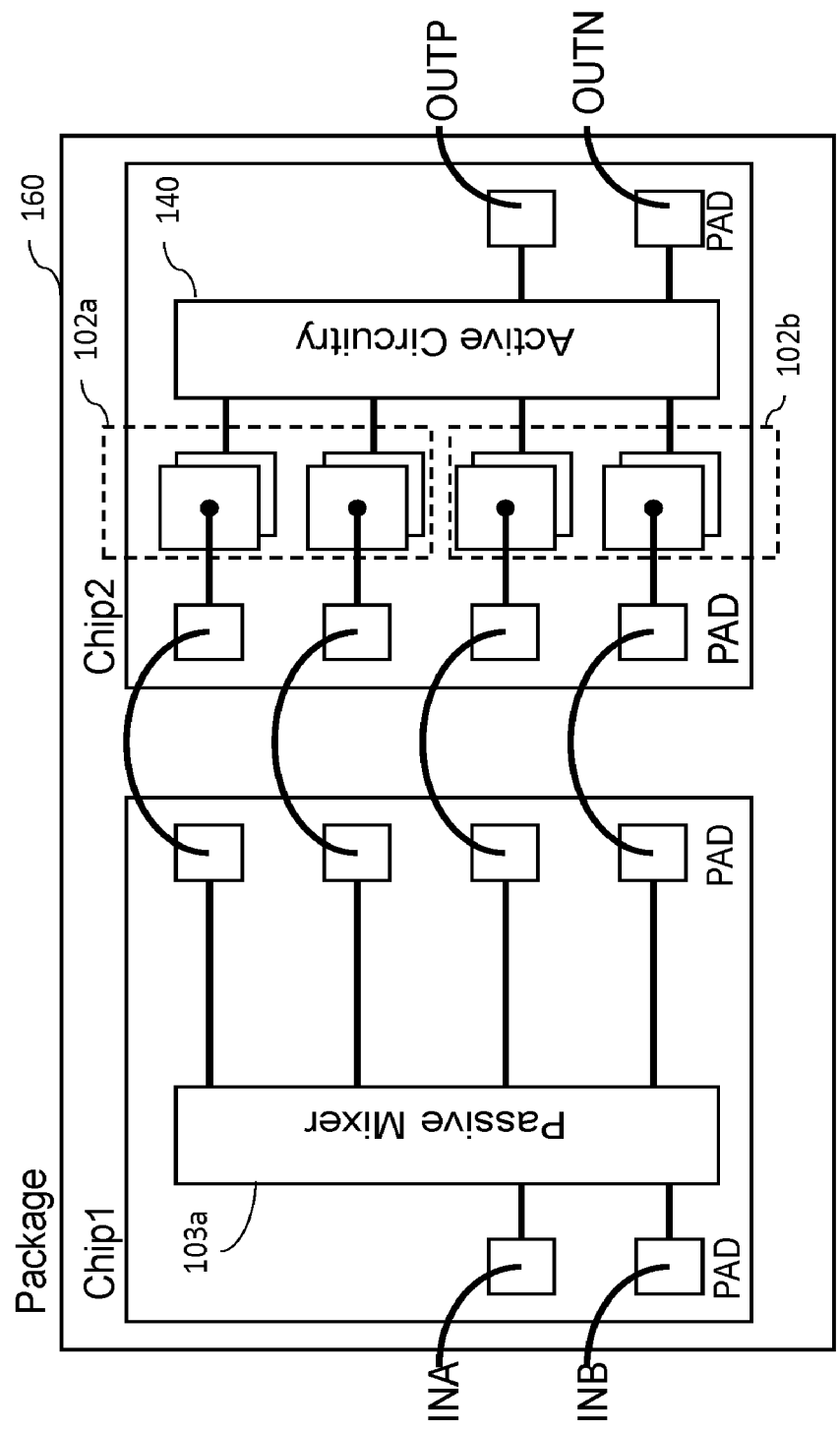
FIG. 13 is an arrangement example of an electronic circuit 160 applicable to the first embodiment.
Figure 14:
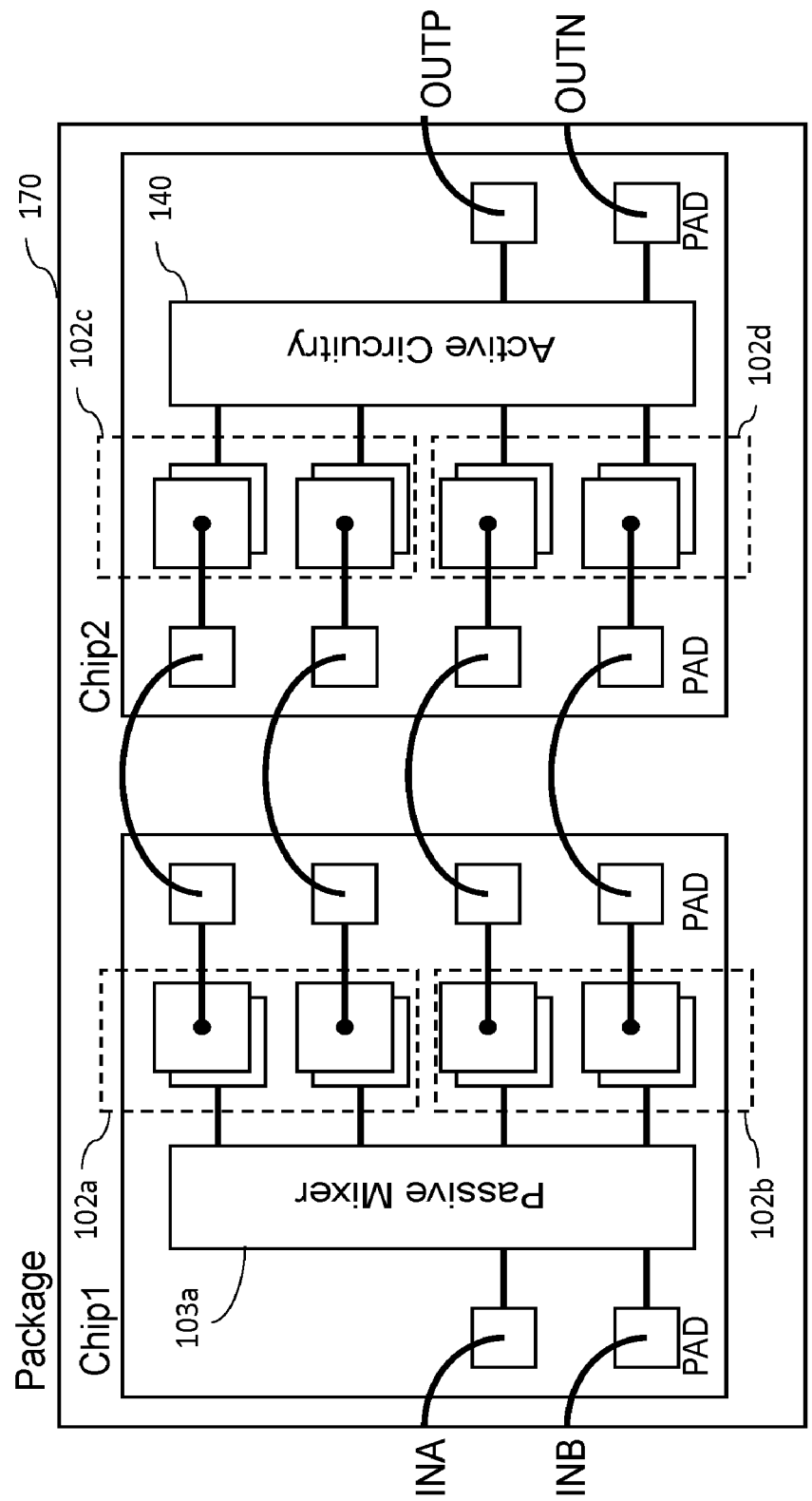
FIG. 14 is an arrangement example of an electronic circuit 170 applicable to the first embodiment.

FIG. 13 illustrates an electronic circuit 160 where the electromagnetic couplers 102a and 102b and the frequency converter 103b are implemented in a single chip and the frequency converter 103a is implemented in another different chip. The frequency converter 103a is implemented in a single chip (Chip1). The electromagnetic couplers 102a and 102b and the active circuitry 140 are implemented in another chip (Chip2).

ARRANGEMENT EXAMPLE 3

An electromagnetic coupler 102c that is connected in series with the electromagnetic coupler 102a and an electromagnetic coupler 102d that is connected in series with the electromagnetic coupler 102b can be also provided. FIG. illustrates an electronic circuit 170 having such a configuration. The electromagnetic couplers 102a and 102b and the frequency converter 103a are implemented in a single chip (Chip1). The electromagnetic couplers 102c and 102d and the active circuitry 140 are implemented in another chip (Chip2). The electromagnetic couplers 102 are configured so that there are two stages, ensuring that the input terminals INA and INB can be isolated electronically from the output terminals OUTP and OUTN of the electronic circuit 170. Furthermore, even if the electromagnetic couplers in one of the chips fail, the other chip can still be isolated electronically to a certain level, improving safety of the device. The electromagnetic couplers 102 can be provided in three or more stages.

ARRANGEMENT EXAMPLE 4

Figure 15:
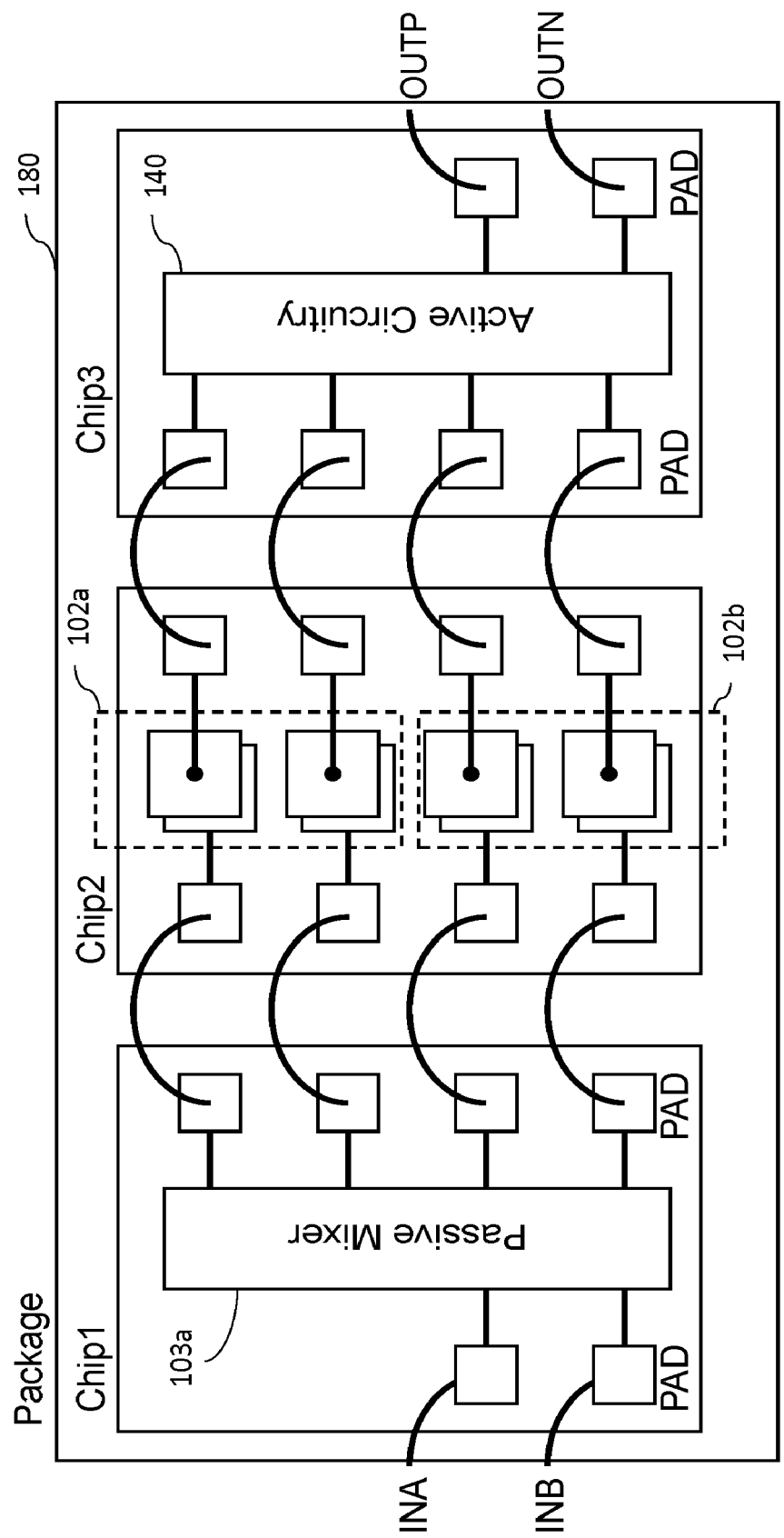
FIG. 15 is an arrangement example of an electronic circuit 180 applicable to the first embodiment.
Figure 16:
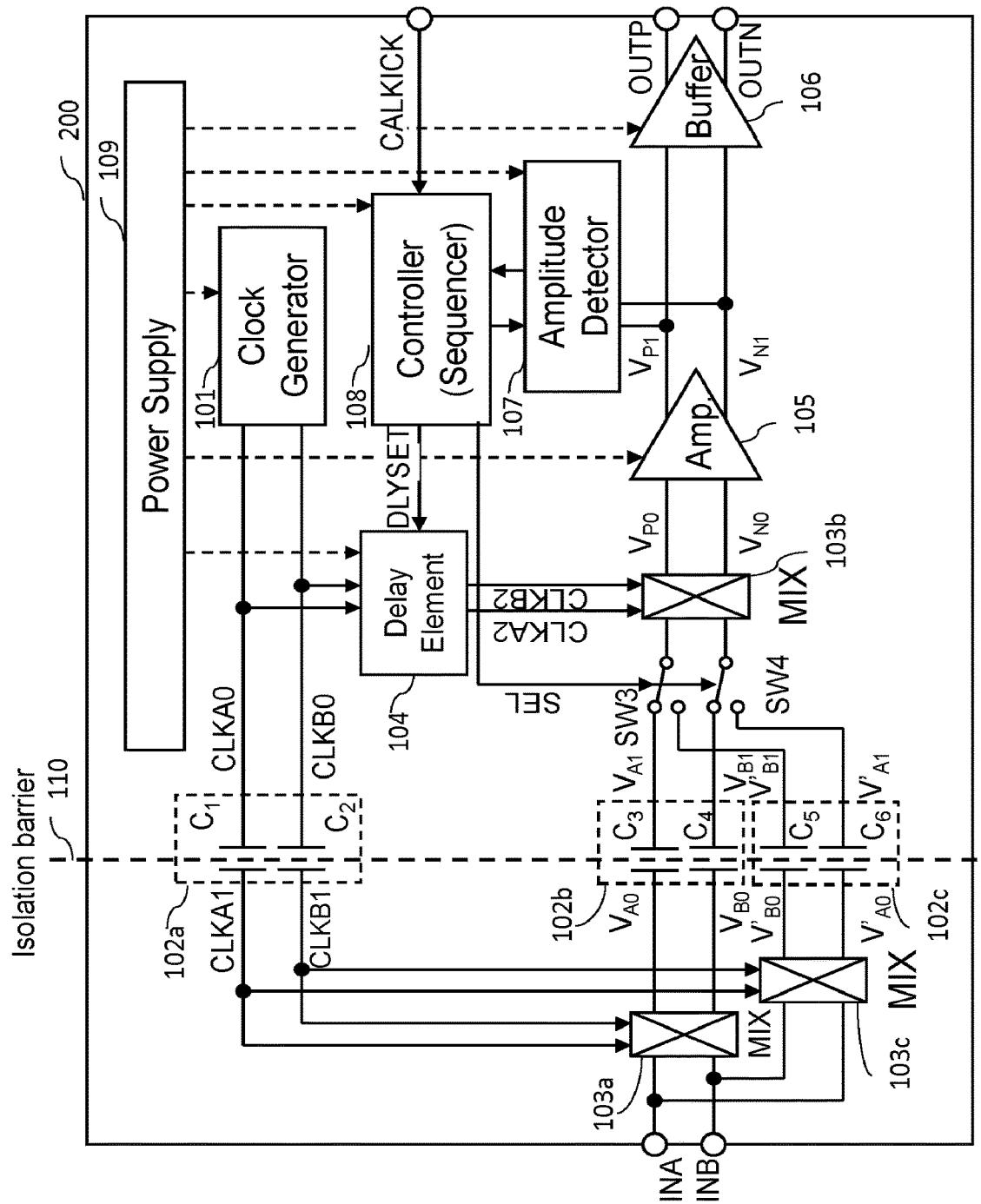
FIG. 16 is a configuration diagram of an electronic circuit 200 according to a second embodiment.

The electromagnetic couplers 102a and 102b can be implemented in another different chip. FIG. 15 illustrates an electronic circuit 180 with such a configuration. The frequency converter 103a is implemented in a single chip (Chip1). The electromagnetic couplers 102a and 102b are implemented in another chip (Chip2). The active circuitry 140 is implemented in a different chip (Chip3).

The embodiment, the variations and the arrangement examples thereof have been described above. The electronic circuit according to the present embodiment uses the phase-delayed clock signals for the frequency conversion between the input signals to the high-frequency signals or the frequency conversion between the high-frequency signals and the restored signals. This ensures that the effect of phase shift when the high-frequency signals are transmitted by electromagnetic coupling are reduced, and the amplitudes and the S/N ratio of the restored signals are improved. Furthermore, the phase delay amounts of the clock signals are determined dynamically in the chip, so that variations of detected temperature, a voltage, and the like can be used during the process. Moreover, since the passive mixer is used as the frequency converter 103a, it is not necessary to supply power to the primary side. This makes it possible to reduce the number of arranged components, reduce the size of device. Also, it lowers consumptions of power. Furthermore, since the substrate potential of the frequency converter 103a is connected to the input terminal INB, the ground terminal is not required.

Second Embodiment

In the first embodiment, when the substrate potential of the frequency converter 103a is connected to the input terminal INB, operation is possible if the voltage of the input terminal INA is greater than the voltage of the input terminal INB. FIG. illustrates an electronic circuit 200 that performs the frequency conversion of the input signals to generate the high-frequency signals and performs the frequency conversion of the high-frequency signals to generate the restored signals without considering the relation between the voltages of the input terminals INA and INB. The electronic circuit 200 further includes a frequency converter 103c, the electromagnetic coupler 102c, switches SW3 and SW4 besides the components of the electronic circuit 100.

The frequency converter 103c is similar to the frequency converter 103a. The frequency converter 103c is driven by the clock signals CLKA1 and CLKB1, and converts the input signals provided from the input terminals INA and INB to high-frequency signals $V'_{A0}$ and $V'_{B0}$.

The electromagnetic coupler 102c is similar to each of the electromagnetic couplers 102a and 102b, including capacitors $C_5$ and $C_6$, and transmitting signals by electromagnetic coupling. The electromagnetic coupler 102c transmits the high-frequency signals $V'_{A0}$ and $V'_{B0}$ to the switches SW3 and SW4 by electromagnetic coupling. This transmission shifts the phases in each of the high-frequency signals $V'_{A0}$ and $V'_{B0}$ used for generating the high-frequency signals $V'_{A1}$ and $V'_{B1}$.

The switches SW3 and SW4 are switched by a signal SEL from the controller 108, and transmits the high-frequency signals $V_{A1}$ and $V_{B1}$ or the high-frequency signals $V'_{A1}$ and $V'_{B1}$ to the frequency converter 103b. The controller 108 determines whether connection is established between the frequency converter 103a or 103c, based on at least either the signals AMPDET or CALAV transmitted from the amplitude detector 107. The controller 108 can determine whether connection is established between the frequency converter 103a or 103c, based on the input from outside of the electronic circuit 200.

When the substrate potential of the frequency converter 103a is connected to the input terminal INB, if the voltage of the input terminal INA is greater than the voltage of the input terminal INB, the electronic circuit 200 connects the switches SW3 and SW4 electrically to the frequency converter 103a. If the voltage of the input terminal INA is smaller than the voltage of the input terminal INB, the electronic circuit 200 connects the switches SW3 and SW4 to the frequency converter 103c. As a result, the electronic circuit 200 can convert the input signals to the high-frequency signals and convert the high-frequency signals to the restored signals regardless of the relations of the voltages in the input terminals INA and INB. Other than the operations described above, the operations executed by the electronic circuit 200 are similar to the operation executed by the electronic circuit 100 described in the first embodiment. Therefore, duplicate descriptions are skipped here. Modifications and arrangement examples of the present embodiment are applicable similarly to the electronic circuit 100.

Third Embodiment

The phase shift occurs in the signals transmitted by electromagnetic coupling, and attenuation of amplitude also occurs due to parasitic components around the electromagnetic couplers 102. The electronic circuit 300 determines not only the delay amount in the delay element 104 but also an amplification factor of the amplifier 105 that compensates the amplitudes of the restored signals. The electronic circuit 300 can ensure that the amplitudes of the input signals at the input terminals INA and INB and the amplitudes of the restored signals at the output terminals OUTP and OUTN approximately equal. It is noteworthy that the amplitudes of the signals are described as voltages.

The electronic circuit 300 includes a circuit similar to the signal path from the input signals to the restored signals $V_{P1}$ and $V_{N1}$ as a replica in addition to the components of the electronic circuit 100. The replica includes the electromagnetic couplers 102c and 102d, the frequency converters 103c, 103d, and an amplifier 105b, and further includes a reference voltage generator 301 (illustrated as Reference Generator in figure) and a feedback circuit 302 (illustrated as Gain Feedback in figure).

The reference voltage generator 301 generates signals (hereinafter, also referred to as reference signals) $V_{RIA0}$ and $V_{RIB0}$ representing reference voltages. The reference voltages are transmitted to the frequency converter 103c and the feedback circuit 302. The reference voltages are converted to the high-frequency signals by the frequency converter 103c, and are used by the feedback circuit 302 to determine the amplification factor of the voltages.

Figure 17:
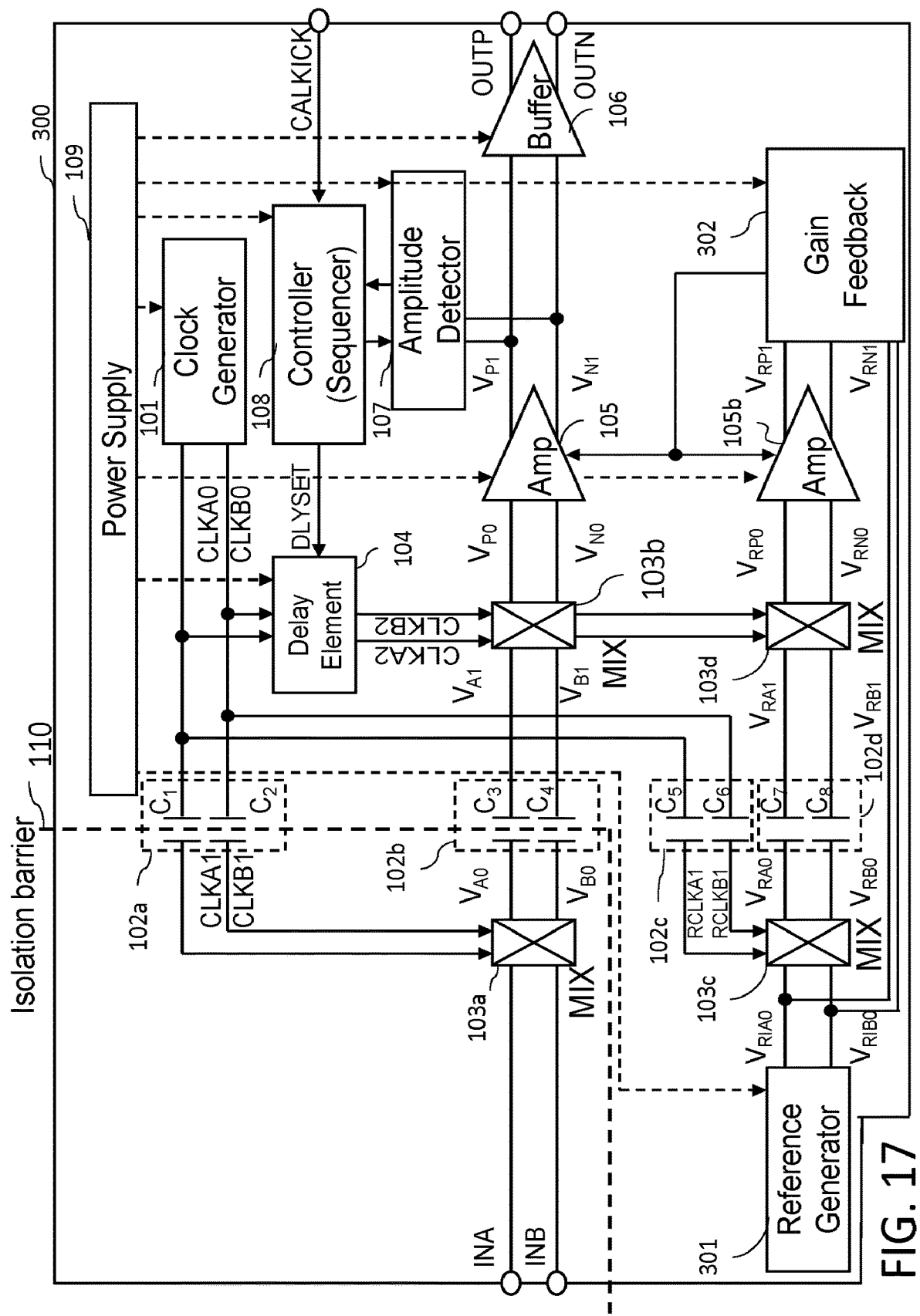
FIG. 17 is a configuration diagram of an electronic circuit 300 according to a third embodiment.

The electromagnetic couplers 102c and 102d transmit signals by electromagnetic coupling between the electromagnetic couplers 102a and 102b. In FIG. 17, each of the electromagnetic couplers 102c and 102d does not include an isolation barrier; however, each of the electromagnetic couplers 102c and 102d may include an isolation barrier. The electromagnetic coupler 102c transmits the clock signals CLKA0 and CLKB0 transmitted from the clock generator 101, by electromagnetic coupling. The phases of the clock signals are shifted due to electromagnetic coupling, and are transmitted as clock signals RCLKA1 and RCLKB1 to the frequency converter 103c. The electromagnetic coupler 102d transmits high-frequency signals $V_{RA0}$ and $V_{RB0}$ converted by the frequency converter 103c described below, by electromagnetic coupling. This transmission causes phase shift and voltage reduction of the high-frequency signals $V_{RA0}$ and $V_{RB0}$, and the signals are input as high-frequency signals $V_{RA1}$ and $V_{RB1}$ to the frequency converter 103d.

The frequency converters 103c and 103d according to this embodiment are each similar to the frequency converter 103b. For example, the frequency converters 103a to 103d can be passive mixers. The frequency converter 103c is driven by the clock signals CLKA1 and CLKB1. The frequency converter 103c converts the signals $V_{RIA0}$ and $V_{RIB0}$ to the high-frequency signals $V_{RA0}$ and $V_{RB0}$. The frequency converter 103d is driven by the clock signals CLKA2 and CLKB2 that are delayed in phase by the delay element 104, and the frequency converter 103d converts the high-frequency signals $V_{RA1}$ and $V_{RB1}$ to restored signals $V_{RP0}$ and $V_{RN0}$. The reference signals $V_{RIA0}$ and $V_{RIB0}$ are signals that have frequencies approximately equal to the frequencies of the restored signals $V_{RP0}$ and $V_{RN0}$, or constant voltages.

The amplifier 105b amplifies the restored signals $V_{RP0}$ and $V_{RN0}$ similarly to the amplifier 105. Amplified restored signals $V_{RP1}$ and $V_{RN1}$ are used by the feedback circuit 302 to determine the amplification factor of the voltages. In the embodiment, for example, the amplifier 105b has a configuration similar to the configuration of the amplifier 105.

The feedback circuit 302 determines the amplification factor of the amplifier 105b based on the reference signals $V_{RIA0}$, $V_{RIB0}$ and the restored signals $V_{RP1}$, $V_{RN1}$. The amplification factor is determined to ensure that the voltage of the reference signal $V_{RIA0}$ and the voltage of the restored signal $V_{RP1}$ are approximately equal to each other and the voltage of the reference signal $V_{RIB0}$ and the voltage of the restored signal $V_{RN1}$ are equal to each other. The feedback circuit 302 transmits the determined amplification factor not only to the amplifier 105b but also to the amplifier 105. Although the voltages of the input signals input from the input terminals INA and INB are not known, the reduction rate of the voltages until the input signals reach the voltages of the restored signals $V_{P1}$ and $V_{N1}$ and the reduction rate of the voltages until the reference signals $V_{RIA0}$ and $V_{RIB0}$ reach the voltages of the restored signals $V_{RP1}$ and $V_{RN1}$ are approximately equal to each other. The amplifier 105 can compensate the attenuated voltages until the input signals become the restored signals $V_{P1}$ and $V_{N1}$.

The power supply 109 supplies power to the reference voltage generator 301, the feedback circuit 302, and the amplifier 105b. In the embodiment, since the frequency converters 103c and 103d are passive mixers, the power supply 109 does not need to supply power to the frequency converters 103c and 103d. If the frequency converters 103c and 103d are mixers requiring power supply, the power supply 109 also supplies power to the frequency converters 103c and 103d.

The electronic circuit 300 converts the reference signals $V_{RIA0}$ and $V_{RIB0}$ to the restored signals $V_{RP1}$ and $V_{RN1}$ by using the frequency converter 103c, the electromagnetic coupler 102d, the frequency converter 103d, and the amplifier 105b. This path is similar to the path that converts the input signals into the restored signals $V_{P1}$ and $V_{N1}$ by using the frequency converter 103a, the electromagnetic coupler 102b, the frequency converter 103b, and the amplifier 105.

The electronic circuit 300 determines the amplification factor to compensate the attenuated voltages until the reference signals $V_{RIA0}$ and $V_{RIB0}$ reach the restored signals $V_{RP1}$ and $V_{RN1}$. The restored signals $V_{P0}$ and $V_{N0}$ are amplified by the determined amplification factor, which can convert the voltages of the restored signals $V_{P1}$ and $V_{N1}$ approximately equal to the voltages of the input signals.

The operation state of the electronic circuit 300 includes the normal operation process and the calibration process, similar to the electronic circuit 100 described with reference to FIG. 7. The amplification factor described in the embodiment can be determined in at least either the normal operation process or the calibration process. The amplification factor can be determined at a timing specified from a device outside of the electronic circuit 300 or can be performed at each timing predetermined within the electronic circuit 300.

In the electronic circuit 300, the operation processes other than the operation processes described above are similar to the operation processed executed by the electronic circuits 100 and 200 described in the first and second embodiments. Therefore, duplicated descriptions are skipped accordingly. Modifications and arrangement examples of the can be applied similarly to the electronic circuits 100 and 200.

Fourth Embodiment

In the electronic circuits according to the first to third embodiments, the components not requiring power supply are implemented in the primary side for reducing and downsizing the circuit scale. In an electronic circuit 400 according to a fourth embodiment, a power supply and the components requiring power supply are also implemented in the primary side. This makes it possible to measure the delay amount of the delay element 104 and determine the amplification factor of the amplifier 105 more accurately by using known signals without using the input signals provided from the input terminals INA and INB.

Figure 18:
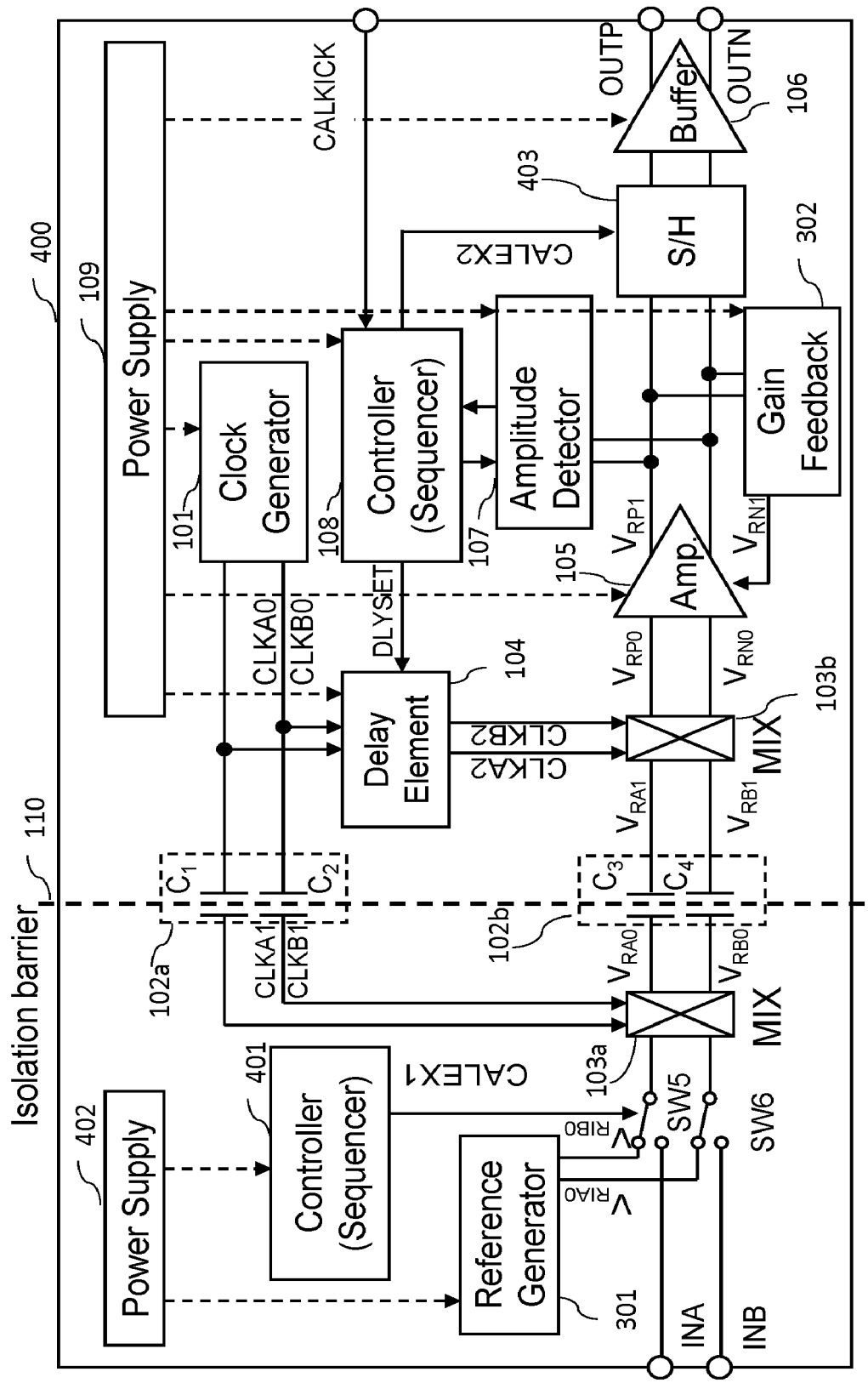
FIG. 18 is a configuration diagram of an electronic circuit 400 according to a fourth embodiment.

FIG. 18 illustrates an electronic circuit 400 having such a configuration. Besides the components of the electronic circuit 100, the electronic circuit 400 includes, the reference voltage generator 301 (illustrated as Reference Generator in figure), a controller 401 (illustrated as Controller (Sequencer) in figure), a power supply 402 (illustrated as Power Supply in figure), the feedback circuit 302 (illustrated as Gain Feedback in figure), a sample-hold circuit 403 (illustrated as S/H in figure), and switches SW5 and SW6.

Similar to the third embodiment, the reference voltage generator 301 generates the reference signals $V_{RIA0}$ and $V_{RIB0}$. The reference signals $V_{RIA0}$ and $V_{RIB0}$ are used for determining the delay amount in the delay element 104 and for determining the amplification factor in the amplifier 105.

The feedback circuit 302 determines the amplification factor to ensure that the voltage of the reference signal $V_{RIA0}$ and the voltage of the input restored signal $V_{RP1}$ are approximately equal to each other and the voltage of the reference signal $V_{RIB0}$ and the voltage of the input restored signal $V_{RN1}$ are approximately equal to each other, and transmits the amplification factor to the amplifier 105, similar to the third embodiment. In this embodiment, for example, the voltages of the reference signals $V_{RIA0}$ and $V_{RIB0}$ are set to the feedback circuit 302 beforehand.

The controller 401 switches the connection points in the switches SW5 and SW6. If the operation state of the electronic circuit 400 is the calibration process, the controller 401 transmits the signal CALEX1 to the switches SW5 and SW6. The switches SW5 and SW6 switch the connection point to the reference voltage generator 301 in response to the signal CALEX1.

The power supply 402 supplies power to the components implemented in the primary side of the electronic circuit 400. In this embodiment, the power supply 402 supplies power to the reference voltage generator 301 and the controller 401.

The sample-hold circuit 403 transmits dummy signals to the output terminals OUTP and OUTN while the operation state of the electronic circuit 400 is in the calibration process. The input signals from the input terminals INA and INB are not used while the operation state of the electronic circuit 400 is in the calibration process. If the operation state of the electronic circuit 400 is in the calibration process, the sample-hold circuit 403 receives a signal CALEX2 from the controller 108. The sample-hold circuit 403 holds the restored signals $V_{P1}$ and $V_{N1}$ when the signal CALEX2 is received. While the operation state of the electronic circuit 400 is in the calibration process, the sample-hold circuit 403 outputs the held restored signals $V_{P1}$ and $V_{N1}$ as the dummy signals to the output terminals OUTP and OUTN. When the operation state of the electronic circuit 400 is the normal operation process, the sample-hold circuit 403 receives the signal CALEX2 from the controller 108, and terminates operation.

The operation executed by the electronic circuit 400 is similar to the operation executed by the electronic circuit 100 that uses the reference signals $V_{RIA0}$ and $V_{RIB0}$ as the input signals during the calibration process. Therefore, overview of the operation executed by the electronic circuit 400 is described. The reference voltage generator 301 generates the reference signals $V_{RIA0}$ and $V_{RIB0}$. The frequency converter 103a converts the reference signals $V_{RIA0}$ and $V_{RIB0}$ to the high-frequency signals $V_{RA0}$ and $V_{RB0}$. The electromagnetic coupler 102b transmits the high-frequency signals $V_{RA0}$ and $V_{RB0}$ by electromagnetic coupling. This transmission converts the high-frequency signals $V_{RA0}$ and $V_{RB0}$ to the high-frequency signals $V_{RA1}$ and $V_{RB1}$. The frequency converter 103b converts the high-frequency signals $V_{RA1}$ and $V_{RB1}$ to the restored signals $V_{RP0}$ and $V_{RN0}$. The amplifier 105 amplifies the restored signals $V_{RP0}$ and $V_{RN0}$ to generate the restored signals $V_{RP1}$ and $V_{RN1}$. The controller 108 uses the restored signals $V_{RP1}$ and $V_{RN1}$ and the amplitude detector 107 to determine the delay amount of the delay element 104. The feedback circuit 302 determines the amplification factor of the amplifier 105 based on the restored signals $V_{RP1}$ and $V_{RN1}$ and the reference signals $V_{RIA0}$ and $V_{RIB0}$.

The electronic circuit 400 uses the known signals from the primary side to determine the delay amount of the delay element 104 and the amplification factor for the amplifier 105 in the secondary side. As a result, the electronic circuit 400 can improve determine the delay amount of the delay element 104 and the amplification factor of the amplifier 105 more accurately. Modifications and arrangement examples of the present embodiment are applicable similarly to the electronic circuits 100, 200, and 300, respectively.

Fifth Embodiment

Figure 19:
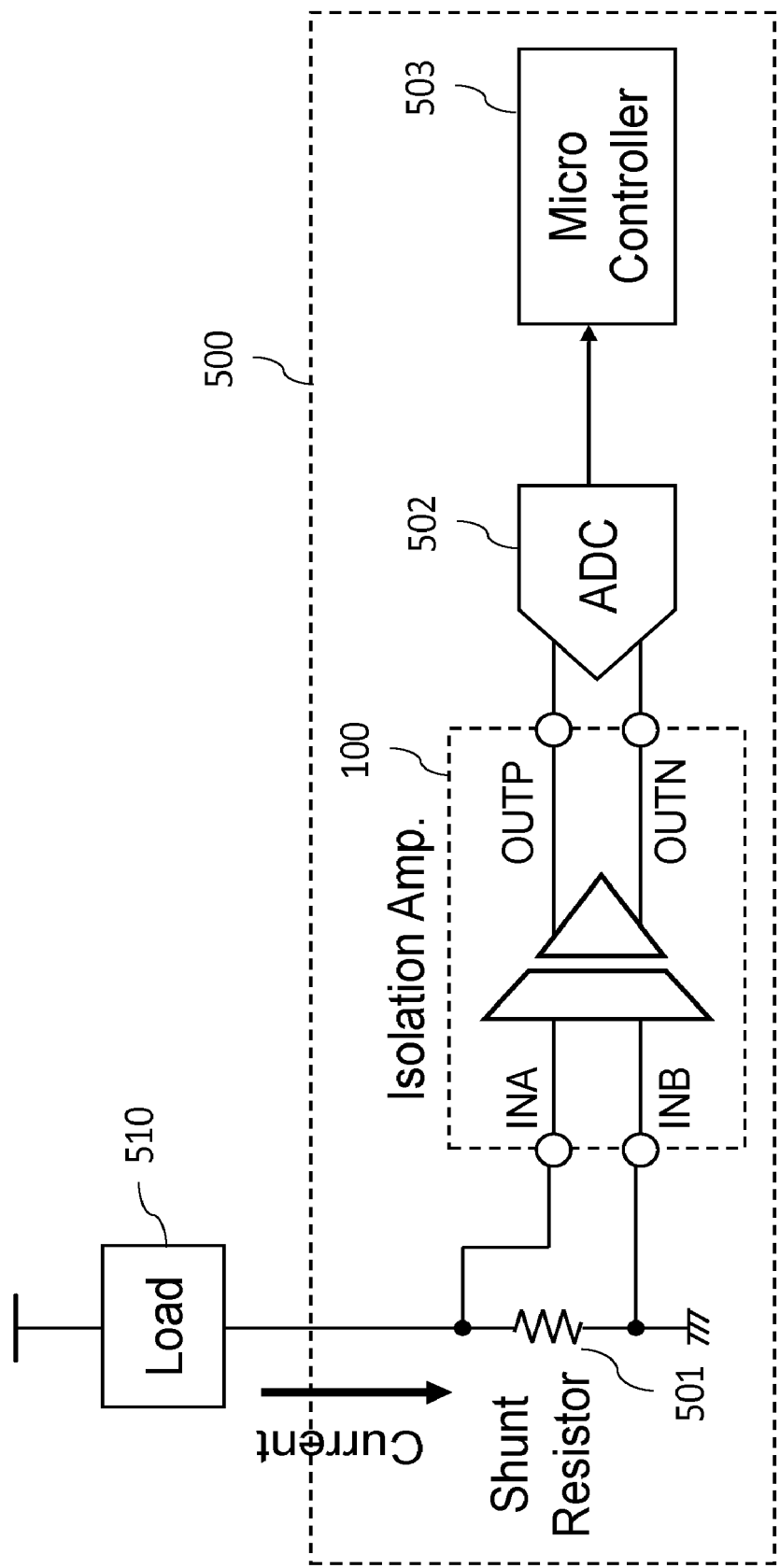
FIG. 19 is a diagram illustrating an electronic apparatus 500 according to a fifth embodiment.

As an exemplary application which uses at least either of the electronic circuits described in the first to fourth embodiments, an electronic apparatus that measures a current of an electronic device and an electric device can be configured. FIG. 19 illustrates such an electronic apparatus 500. In the embodiment, for example, an electronic circuit provided in the electronic apparatus 500 is the electronic circuit 100; however, any of the electronic circuits described in the first to fourth embodiments can be applied. The electronic apparatus 500 includes a resistor 501 (illustrated as Shunt Resistor in the figure), the electronic circuit 100 (illustrated as Isolation Amp. in the figure), an analog-to-digital converter 502 (illustrated as ADC in the figure), and a micro controller 503 (illustrated as Micro Controller in the figure). The electronic apparatus 500 measures a current of a device 510 (illustrated as Load in the figure). An electronic device and an electric device are applicable to the device 510. As the electronic device, for example, a device performing digital processing and analog processing is applicable. As the electric device, for example, a motor and a smart meter are applicable.

The resistor 501 is connected to the ground and the device 510. The resistor 501 is a shunt resistor that converts a current flowing through the device 510 to a voltage. Voltages at both ends of the resistor 501 are transmitted as input signals to the electronic circuit 100. An optional resistor is applicable to the resistor 501. The resistor 501 can be connected between the device 510 and a power supply.

As described in the first to fourth embodiments, the electronic circuit 100 transmits the input signals input from the input terminals INA and INB as the restored signals $V_{P1}$ and $V_{N1}$ to the output terminals OUTP and OUTN through the isolation barrier 110. Since the electronic circuit 100 includes the isolation barrier 110 internally, even if the voltage of the device 510 is high, it is possible to prevent failure of the analog-to-digital converter 502 and the micro controller 503.

The analog-to-digital converter 502 converts the input restored signals $V_{P1}$ and $V_{N1}$ into digital signals, and outputs the digital signals to the micro controller 503. The micro controller 503 displays the input digital signals. A display form is optional, and the digital signals may be visually displayed as a graph or may be converted into a form usable as data. Note that the micro controller 503 is an example of the output device of the analog-to-digital converter 502, and the output device is optional. For example, the output device can be a display that visually displays the current of the device 510, or may be a controller that performs control with use of the data of the current of the device 510.

As described above, the electronic apparatus 500 can measure the current of the connected electronic device and the connected electric device, and digitalize and output the current.

Some embodiments, and the variations, the arrangement examples, and the exemplary applications thereof have been described above. The embodiments, the variations, the arrangement examples, and the exemplary applications can be combined and implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit, comprising:
a clock generator configured to generate a first clock signal;
a delay element configured to output a second clock signal which has a phase delayed with respect to the first clock signal;
a first electromagnetic coupler configured to transmit one of the first and second clock signals by electromagnetic coupling;
a first frequency converter driven by the one of the first and second clock signals transmitted from the first electromagnetic coupler and configured to convert a first input signal to a first signal with a first frequency corresponding to the one of the first and second clock signals;
a second electromagnetic coupler configured to transmit the first signal by electromagnetic coupling;
a second frequency converter configured to convert the first signal transmitted from the second electromagnetic coupler, to a second signal with a second frequency corresponding to the first input signal, by using the other of the first and second clock signals;
a controller configured to determine a delay amount of the first clock signal at the delay element based on an amplitude of the second signal; and
an output device configured to output the second signal.

2. The electronic circuit according to claim 1, wherein the controller is configured to determine the delay amount of the delay element based on a maximum value of the amplitude of the second signal.

3. The electronic circuit according to claim 1, wherein
the first electromagnetic coupler and the second electromagnetic coupler are at least either a capacitor or a transformer, and
the first electromagnetic coupler and the second electromagnetic coupler can be coupled electromagnetically with an isolation barrier between the first electromagnetic coupler and the second electromagnetic coupler.

4. The electronic circuit according to claim 1, further comprising a measurement apparatus configured to measure a time, wherein
the controller is configured to determine the delay amount in the delay element based on the time which has elapsed since the delay amount was determined last time.

5. The electronic circuit according to claim 1, wherein the controller is configured to receive a third signal that instructs to start determining the delay amount of the delay element, and start determining the delay amount of the delay element.

6. The electronic circuit according to claim 1, wherein
the electronic circuit includes a first chip and a second chip,
the first chip includes the first electromagnetic coupler, the second electromagnetic coupler, and the first frequency converter, and
the second chip includes the second frequency converter.

7. The electronic circuit according to claim 1, wherein
the electronic circuit includes a first chip and a second chip,
the first chip includes the first electromagnetic coupler, the second electromagnetic coupler, and the second frequency converter, and
the second chip includes the first frequency converter.

8. The electronic circuit according to claim 1, further comprising:
a third electromagnetic coupler connected to the first electromagnetic coupler and configured to transmit a signal transmitted from the first electromagnetic coupler, by electromagnetic coupling; and
a fourth electromagnetic coupler connected to the second electromagnetic coupler and configured to transmit a signal transmitted from the second electromagnetic coupler, by electromagnetic coupling, wherein
the electronic circuit includes a first chip and a second chip,
the first chip includes the first electromagnetic coupler and the second electromagnetic coupler, and
the second chip includes the third electromagnetic coupler and the fourth electromagnetic coupler.

9. The electronic circuit according to claim 1, wherein
the electronic circuit includes a first chip, a second chip, and a third chip,
the first chip includes the first frequency converter,
the second chip includes the first electromagnetic coupler and the second electromagnetic coupler, and
the third chip includes the second frequency converter.

10. An electronic apparatus that measures a current of an electronic device or an electric device, the electronic apparatus comprising:
a resistor connected to the electronic device or the electric device;
the electronic circuit according to claim 1; and
an analog-to-digital converter configured to convert the second signal to a digital signal and to output the digital signal, wherein
the first input signal is acquired from the resistor.

11. A method, comprising:
generating a first clock signal;
outputting a second clock signal which has a phase delayed with respect to the first clock signal;
transmitting one of the first and second clock signals by electromagnetic coupling;
converting a first input signal to a first signal with a first frequency corresponding to the one of the first and second clock signals transmitted by the electromagnetic coupling, in response to the one of the first and second clock signals;
transmitting the first signal by the electromagnetic coupling;
converting the first signal transmitted by the electromagnetic coupling, to a second signal with a second frequency corresponding to the first input signal, using the other of the first and second clock signals;
determining a delay amount of the first clock signal, based on an amplitude of the second signal; and
outputting the second signal.

* * * * *